(12) United States Patent
Becker et al.

(10) Patent No.: US 10,978,597 B2
(45) Date of Patent: Apr. 13, 2021

(54) SENSOR

(71) Applicant: OSRAM Opto Semiconductors GmbH, Regensburg (DE)

(72) Inventors: Dirk Becker, Langquaid (DE); Matthias Sperl, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 77 days.

(21) Appl. No.: 16/339,523

(22) PCT Filed: Oct. 5, 2017

(86) PCT No.: PCT/EP2017/075395
§ 371 (c)(1),
(2) Date: Apr. 4, 2019

(87) PCT Pub. No.: WO2018/065537
PCT Pub. Date: Apr. 12, 2018

(65) Prior Publication Data
US 2019/0237590 A1    Aug. 1, 2019

(30) Foreign Application Priority Data

Oct. 6, 2016  (DE) ..................... 10 2016 118 990.1

(51) Int. Cl.
| | |
|---|---|
| H01L 29/16 | (2006.01) |
| H01L 31/02 | (2006.01) |
| H01L 25/16 | (2006.01) |
| H01L 33/44 | (2010.01) |
| H01L 33/48 | (2010.01) |
| H01L 33/62 | (2010.01) |
| H01L 31/16 | (2006.01) |

(Continued)

(52) U.S. Cl.
CPC ...... *H01L 31/02002* (2013.01); *H01L 25/167* (2013.01); *H01L 31/16* (2013.01); *H01L 33/44* (2013.01); *H01L 33/486* (2013.01); *H01L 33/62* (2013.01); *H01L 33/0025* (2013.01); *H01L 33/0095* (2013.01); *H01L 33/58* (2013.01); *H01L 2933/0033* (2013.01); *H01L 2933/0066* (2013.01)

(58) Field of Classification Search
CPC ....... H01L 31/16; H01L 25/167; H01L 33/44; H01L 33/486; H01L 33/62
USPC ............................................ 257/82, 99, 432
See application file for complete search history.

(56) References Cited

U.S. PATENT DOCUMENTS 6,188,527 B1   2/2001 Bohn
6,566,745 B1 * 5/2003 Beyne ............... H01L 27/14618
                                                           257/431

(Continued)

FOREIGN PATENT DOCUMENTS

DE    10 2014 116 080    5/2016

*Primary Examiner* — Nitin Parekh
(74) *Attorney, Agent, or Firm* — DLA Piper LLP (US)

(57) ABSTRACT

A sensor includes a printed circuit board; at least one semiconductor chip arranged on the printed circuit board and includes a front-side contact, wherein the semiconductor chip is a radiation-detecting semiconductor chip; an embedding layer arranged on the printed circuit board and laterally adjoining the at least one semiconductor chip; and a contact layer connected to the front-side contact of the at least one semiconductor chip.

12 Claims, 10 Drawing Sheets

(51) Int. Cl.
  *H01L 33/00* (2010.01)
  *H01L 33/58* (2010.01)

(56) References Cited

U.S. PATENT DOCUMENTS

| | | | |
|---|---|---|---|
| 9,035,326 B2 * | 5/2015 | Cho | F21S 41/151 257/82 |
| 2009/0179207 A1 * | 7/2009 | Chitnis | H01L 33/10 257/88 |
| 2010/0181582 A1 * | 7/2010 | Li | H01L 33/54 257/91 |
| 2011/0169118 A1 * | 7/2011 | Sano | H01L 27/14618 257/432 |
| 2011/0260184 A1 * | 10/2011 | Furuyama | H01L 33/38 257/98 |
| 2012/0007076 A1 * | 1/2012 | Cho | F21S 41/192 257/48 |
| 2012/0133956 A1 | 5/2012 | Findlay et al. | |
| 2012/0220082 A1 | 8/2012 | Ng et al. | |
| 2012/0299191 A1 | 11/2012 | Camacho | |
| 2013/0264592 A1 * | 10/2013 | Bergmann | H01L 33/50 257/88 |
| 2014/0319548 A1 | 10/2014 | Luan | |
| 2015/0001707 A1 | 1/2015 | Do et al. | |
| 2015/0362165 A1 * | 12/2015 | Chu | H01L 27/156 362/235 |
| 2016/0056194 A1 | 2/2016 | Rudmann et al. | |
| 2016/0187483 A1 | 6/2016 | Luan et al. | |
| 2017/0331018 A1 | 11/2017 | Singer et al. | |

* cited by examiner

SENSOR

TECHNICAL FIELD

This disclosure relates to a sensor comprising a printed circuit board and at least one radiation-detecting semiconductor chip as well as a method of producing sensors.

BACKGROUND

Optical sensors may comprise a printed circuit board and at least one radiation-detecting semiconductor chip arranged on the printed circuit board. In a further configuration, at least one radiation-emitting semiconductor chip may additionally be arranged on the printed circuit board.

The semiconductor chips may comprise a rear-side contact and a front-side contact. A semiconductor chip may connect to a contact surface of a printed circuit board via the rear-side contact and an electrically conductive connection means. The front-side contact of a semiconductor chip may connect to a contact surface of a printed circuit board via a bond wire.

There is nonetheless a need to provide an improved sensor and a corresponding method of producing sensors.

SUMMARY

We provide a sensor including a printed circuit board; at least one semiconductor chip arranged on the printed circuit board and including a front-side contact, wherein the semiconductor chip is a radiation-detecting semiconductor chip; an embedding layer arranged on the printed circuit board and laterally adjoining the at least one semiconductor chip; and a contact layer connected to the front-side contact of the at least one semiconductor chip.

We also provide a method of producing sensors including providing a printed circuit board; arranging semiconductor chips on the printed circuit board, wherein the semiconductor chips include a front-side contact, and for each sensor, at least one radiation-detecting semiconductor chip is arranged on the printed circuit board; applying an embedding material on the printed circuit board that forms an embedding layer, laterally adjoining the semiconductor chips; forming contact layers connected to the front-side contacts of the semiconductor chips; and singulating the printed circuit board provided with the semiconductor chips, the embedding layer and the contact layers into separate sensors each including at least one radiation-detecting semiconductor chip.

LIST OF REFERENCE SIGNS

Figure 1:
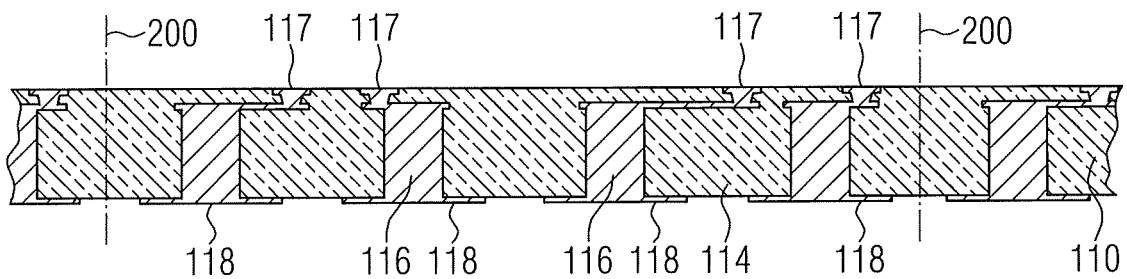
FIGS. 1 to 8 show one possible method of producing sensors on the basis of lateral illustrations, where the sensors comprise a printed circuit board, semiconductor chips, an embedding layer, contact layers and optical elements.

100 Sensor
110 Printed circuit board
114 Insulating material
116 Conductor structure
117 Contact surface
118 Contact surface
121 Semiconductor chip, emitter
122 Semiconductor chip, detector
124 Detection region
125 Front-side contact
130 Embedding layer
135 Cutout
140 Contact layer
150 Insulating layer
155 Electrical connection element
160 Optical element
170 Barrier structure
171 Recess
180 Radiation-transmissive layer
185 Trench structure
190 Cover
200 Separating line
210 Ventilation hole

DETAILED DESCRIPTION

Our sensor may comprise a printed circuit board and at least one semiconductor chip arranged on the printed circuit board. The semiconductor chip comprises a front-side contact. Moreover, the semiconductor chip is a radiation-detecting semiconductor chip. A further constituent of the sensor is an embedding layer arranged on the printed circuit board and laterally adjoining the at least one semiconductor chip. Furthermore, the sensor comprises a contact layer connected to the front-side contact of the at least one semiconductor chip.

In the sensor, the front-side contact of the least one semiconductor chip is electrically contacted with the aid of a contact layer. As a result, the sensor may comprise a smaller structural height compared to sensors whose semiconductor chips are contacted with the aid of bond wires. This space advantage proves to be expedient if only a limited structural space is available for the sensor. This holds true, for example, with regard to a possible application of the sensor in a mobile device.

A further advantage of the contact layer is a higher stability compared to bond wires. In this way, the sensor may comprise a high reliability and lifetime. This is true even if large temperature fluctuations are present. This property fosters, for example, one possible application of the sensor in a motor vehicle.

Further possible details and examples that may be considered for the sensor are described more specifically below.

The printed circuit board may also be referred to as a PCB or PCB substrate. In one example, the printed circuit board comprises an insulating material and electrical conductor structures. The insulating material may be a prepreg material such as, for example, an FR4 or BT material (bismaleimide triazine). The conductor structures may be formed from a metallic material and comprise contact surfaces.

The printed circuit board may comprise two main sides, wherein the at least one semiconductor chip and the embedding layer are arranged on one of the main sides. The conductor structures may comprise contact surfaces arranged at the two main sides and accessible here. Furthermore, the conductor structures may comprise constituents extending through the printed circuit board and/or located within the printed circuit board such as, for example, plated-through holes, conductive layers and the like, via which contact surfaces arranged at the different main sides may electrically connect to one another.

The embedding layer arranged on the printed circuit board may circumferentially completely enclose the at least one semiconductor chip. The embedding layer may be formed from an electrically insulating embedding material. The embedding material may be radiation-nontransmissive and comprise a black or white color, for example. A front side of the at least one semiconductor chip may be free of the embedding material and hence not covered with the embedding layer.

The radiation-detecting semiconductor chip may comprise a photodiode structure. A configuration in which the radiation-detecting semiconductor chip comprises a plurality of detection regions, for example, in the form of a plurality of photodiode structures is also possible. The plurality of detection regions may be configured to enable detection of radiation in different wavelength ranges.

It is furthermore possible for the radiation-detecting semiconductor chip additionally to comprise circuit structures for evaluation. In this example, the radiation-detecting semiconductor chip may be, for example, an ASIC chip (Application Specific Integrated Circuit).

The electrically conductive contact layer connected to the front-side contact of the at least one semiconductor chip may be produced using a planar connection technology (PI, Planar Interconnect). Therefore, the contact layer may be a so-called PI contact, also referred to as Picos contact (Planar Interconnect Chip on Substrate). The contact layer may be arranged on the semiconductor chip or on the front-side contact thereof, the embedding layer and at least one further constituent of the sensor. The contact layer may be formed from a metallic material.

In a further example, the sensor additionally comprises an insulating layer that covers the at least one semiconductor chip on the front side at the edge or in the region of the front-side contact and also the embedding layer in this region. In this configuration, the contact layer may be arranged partly on the insulating layer. With the aid of the insulating layer, it is possible to prevent the front-side contact of the semiconductor chip from being short-circuited with a sidewall of the semiconductor chip via the contact layer.

Via the contact layer, it is possible to produce an electrical connection between the front-side contact of the at least one semiconductor chip and a contact surface of the printed circuit board. For this purpose, in accordance with a further example, the embedding layer comprises a cutout via which such a contact surface of the printed circuit board is at least partly uncovered. The contact layer connects to the uncovered contact surface of the printed circuit board. In this example, the contact layer may extend as far as the cutout and be arranged within the cutout on the contact surface.

An electrical connection between the front-side contact of the at least one semiconductor chip and a contact surface of the printed circuit board may not be produced exclusively via the contact layer. This holds true, for example, for the following example in which the sensor comprises an electrical connection element arranged on a contact surface of the printed circuit board. In this example, the embedding layer laterally adjoins the electrical connection element, and the contact layer connects to the electrical connection element. The electrical connection element may be, for example, a body formed from a metallic material. In a further possible configuration, the electrical connection element is a metallized body comprising silicon, for example. The electrical connection element may connect to the relevant contact surface of the printed circuit board via an electrically conductive connection means such as, for example, an electrically conductive adhesive, a solder or a sintering paste. The embedding layer may circumferentially completely enclose the electrical connection element. The contact layer may be arranged on the electrical connection element.

The at least one semiconductor chip may furthermore comprise a rear-side contact. Via the rear-side contact and an electrically conductive connection means such as, for example, an electrically conductive adhesive, a solder or a sintering paste, the semiconductor chip may electrically connect to a further contact surface of the printed circuit board.

It is furthermore possible for the at least one semiconductor chip to comprise not just one but a plurality of front-side contacts. In a corresponding manner, the at least one semiconductor chip may comprise a plurality of rear-side contacts. In such designs, examples and details described above may be applied in a corresponding manner for the plurality of contacts. If the semiconductor chip comprises a plurality of front-side contacts, for example, a contact layer may connect to each front-side contact. Furthermore, an insulating layer to avoid short circuits may be provided in the region of each front-side contact. Such aspects may also apply to the configurations described below.

The sensor may be realized with just a single radiation-detecting semiconductor chip, or with a plurality of semiconductor chips. With regard to the latter example, the sensor in accordance with a further example comprises, besides the radiation-detecting semiconductor chip, at least one further semiconductor chip arranged on the printed circuit board and comprising a (at least one) front-side contact laterally adjoined by the embedding layer. In this example, a further contact layer is provided connected to the front-side contact of the further semiconductor chip.

With regard to the further semiconductor chip, the examples and details described above may be applied in a corresponding manner. By way of example, the front-side contact of the further semiconductor chip may likewise electrically connect to a contact surface of the printed circuit board. For this purpose, the contact layer may connect to the front-side contact of the further semiconductor chip to connect to a contact surface of the printed circuit board at least partly uncovered via a cutout of the embedding layer.

It is also possible for the relevant contact layer to connect to a further electrical connection element arranged on a contact surface of the printed circuit board. The embedding layer may laterally adjoin the further electrical connection element.

In a corresponding manner, an insulating layer may additionally be provided that partly covers the further semiconductor chip in the region of the front-side contact and also the embedding layer in this region to avoid a short circuit. Furthermore, the further semiconductor chip may comprise a rear-side contact and electrically connect to a contact surface of the printed circuit board via the rear-side contact and an electrically conductive connection means.

The sensor may also be realized with a larger number of semiconductor chips, i.e. with a plurality of further semiconductor chips arranged on the printed circuit board and thus overall with more than two semiconductor chips. In this example, the embodiments and details described above may be applied with regard to each further semiconductor chip.

The at least one further semiconductor chip may be a radiation-emitting semiconductor chip. The radiation-emitting semiconductor chip may be, for example, a light-emitting diode chip or LED chip (LED). Furthermore, the radiation-emitting semiconductor chip may be configured, for example, to emit infrared light radiation. A configuration to emit visible light radiation is also possible.

The radiation-detecting semiconductor chip may be configured to detect radiation emitted by the radiation-emitting semiconductor chip and reflected in a suitable manner. In this way, the sensor may be, for example, a proximity sensor or a biomonitoring sensor.

Configurations in which the sensor comprises a plurality of radiation-detecting and/or a plurality of radiation-emitting semiconductor chips are furthermore possible. Semiconductor chips of this type may be configured as described above. Furthermore, the radiation-detecting semiconductor chip or the plurality of radiation-detecting semiconductor chips may be configured to detect the reflected radiation(s) of the radiation-emitting semiconductor chip or of the plurality of radiation-emitting semiconductor chips.

The sensor may comprise at least one semiconductor chip of a different type besides one or a plurality of optoelectronic semiconductor chips. This may involve, for example, an IC chip (Integrated Circuit) such as a driver chip, for example.

The sensor may comprise at least one further component part arranged on the printed circuit board provided with the at least one semiconductor chip, the embedding layer and the at least one contact layer. The relevant component part may be arranged on a surface that constituted of the semiconductor chip or the plurality of semiconductor chips, the embedding layer and the contact layer(s). If appropriate, the surface may in part also be constituted of at least one further constituent, for example, by one or a plurality of the above-described insulating layers used to avoid a short circuit. On account of the contact layer(s), this surface may be relatively planar and comprise a small topography. This may foster production of the sensor. The following configurations may be considered with regard to the further component part arranged on the surface.

At least one radiation-transmissive optical element may be arranged on the printed circuit board provided with the at least one semiconductor chip, the embedding layer and the at least one contact layer. The optical element may be in the region of the at least one semiconductor chip and arranged on the semiconductor chip. Depending on the type of semiconductor chip, a shaping of a radiation received or emitted by the semiconductor chip may be achieved with the aid of the optical element. The optical element may be, for example, a lens comprising a curved surface. In a configuration of the sensor comprising a plurality of semiconductor chips, the sensor may comprise a plurality of radiation-transmissive optical elements. In this example, each optical element may be located in the region of a corresponding semiconductor chip.

The configuration of the sensor comprising one or a plurality of contact layers enables a high efficiency of the optical element(s). This is because disturbances in the optical channel such as may be caused by bond wires, may be avoided in this configuration.

At least one radiation-nontransmissive optical barrier structure may be arranged on the printed circuit board provided with the at least one semiconductor chip, the embedding layer and the at least one contact layer. The barrier structure may be formed from a radiation-nontransmissive material.

The example mentioned above may be considered with regard to a configuration of the sensor in which the sensor comprises at least one radiation-detecting semiconductor chip and at least one radiation-emitting semiconductor chip. Crosstalk between a radiation-emitting semiconductor chip and a radiation-detecting semiconductor chip may be suppressed with the aid of a light-blocking barrier structure. This means that, with the aid of the barrier structure, it is possible at least partly to prevent radiation emitted by a radiation-emitting semiconductor chip from passing to a radiation-detecting semiconductor chip without an interaction or radiation reflection provided for operation of the sensor occurring beforehand. The barrier structure, relative to a plan view consideration of the sensor, may be present at least partly in a region located between a radiation-detecting semiconductor chip and a radiation-emitting semiconductor chip. The barrier structure may be realized, for example, in the form of an elongate or linear section. The sensor may also be realized with a plurality of elongate barrier structures. A configuration in which the barrier structure comprises a plurality of continuous elongate sections is furthermore possible. In a further possible configuration, the barrier structure comprises a frame-type shape.

With regard to the above-described configuration of the sensor comprising the at least one radiation-transmissive optical element, it is possible for such an optical element to also be partly arranged on at least one barrier structure or to partly overlap the at least one barrier structure. Conversely, it is possible for the at least one barrier structure to also be partly arranged on at least one optical element or to partly overlap or wet the at least one optical element.

A radiation-transmissive cover may be arranged on the at least one radiation-nontransmissive barrier structure. Protection of underlying constituents such as of the at least one semiconductor chip, for example, against external influences may be achieved in this way. The cover may be laminar and formed from a glass or plastics material.

A radiation-transmissive layer may be arranged on the printed circuit board provided with the at least one semiconductor chip, the embedding layer and the at least one contact layer. Protection of the at least one semiconductor chip against external influences may likewise be achieved with the aid of the radiation-transmissive layer.

It is possible for the radiation-transmissive layer to comprise separate and/or interconnected layer sections. At least one radiation-nontransmissive barrier structure or at least one section of a barrier structure may be located between such layer sections.

The radiation-transmissive layer may comprise a trench structure. A radiation-nontransmissive barrier structure is arranged in the region of the trench structure.

The at least one semiconductor chip and the embedding layer may be arranged directly on the printed circuit board. In this example, the at least one semiconductor chip may connect to the printed circuit board via a connection means, for example, an adhesive, a solder or a sintering paste. In a configuration of the sensor comprising a plurality of semiconductor chips or comprising at least one further semiconductor chip, as has been described above, the plurality of semiconductor chips may connect to the printed circuit board via a connection means in a corresponding manner. The embedding layer may directly adjoin the printed circuit board.

We also provide a method of producing sensors is proposed. The method comprises providing a printed circuit board and arranging semiconductor chips on the printed circuit board. The semiconductor chips comprise a front-side contact. For each sensor to be produced, at least one radiation-detecting semiconductor chip is arranged on the printed circuit board. Provision is furthermore made to apply an embedding material on the printed circuit board to form an embedding layer laterally adjoining the semiconductor chips. A further step is forming contact layers connected to the front-side contacts of the semiconductor chips. Furthermore, the method involves singulating the printed circuit board provided with the semiconductor chips, the embedding layer and the contact layers into separate sensors each comprising at least one radiation-detecting semiconductor chip. These method steps may be carried out in the order indicated above.

The method involves producing a contiguous assemblage comprising a plurality of sensors subsequently singulated into separate sensors. On account of the sensors being fabricated as an assemblage, the method may also be referred to as a wafer-level production method. In the method, individual production steps may be carried out in parallel for all of the jointly fabricated sensors. This holds true, for example, to form the contact layers connected to the front-side contacts of the semiconductor chips. Compared to wire contacting to connect bond wires, which may only be carried out successively, this step may be carried out more rapidly and more cost-effectively. The achievable cost advantage may be manifested to a significant extent in relatively large production volumes.

The sensors produced with the aid of the method may comprise the construction described above or a construction in accordance with one or more of the examples described above. Therefore, features and details described above may be applied in a corresponding manner for the production method.

By way of example, the semiconductor chips may be arranged directly on the printed circuit board. In this example, the semiconductor chips may be secured on the printed circuit board via a connection means, for example, an adhesive, a solder or a sintering paste. The embedding material may be applied directly on the printed circuit board such that the embedding layer adjoins the printed circuit board.

Further possible details and examples which may be considered for the method and the sensors are described more specifically below.

The sensors produced with the aid of the method may comprise a single semiconductor chip or a plurality of semiconductor chips. The latter example may be realized by arranging, for each sensor to be produced, at least one further semiconductor chip comprising a front-side contact on the printed circuit board. The at least one further semiconductor chip may be a radiation-emitting semiconductor chip. Furthermore, it is possible to fabricate sensors comprising a plurality of radiation-detecting semiconductor chips and/or a plurality of radiation-emitting semiconductor chips. Furthermore, it is possible to realize sensors comprising at least one semiconductor chip of a different type, for example, a driver chip, besides one or a plurality of optoelectronic semiconductor chips.

The semiconductor chips used in the method may comprise a rear-side contact. When arranging the semiconductor chips on the printed circuit board, the semiconductor chips may connect to contact surfaces of the printed circuit board via the rear-side contacts of the semiconductor chips and an electroconductive connection means.

The embedding material may be a plastics material such as, for example, an epoxy material or a hybrid material comprising an epoxy material and a silicone material. The embedding material may be applied in liquid or viscous form and then cured. The embedding material, which may furthermore contain a filler, may comprise a black or white color. Applying the embedding material on the printed circuit board may be carried out such that the embedding layer constituted thereby extends as far as a front side of the semiconductor chips. In this example, the semiconductor chips may be circumferentially enclosed by the embedding layer and the front sides of the semiconductor chips may be uncovered. If this is not possible and semiconductor chips are covered with the embedding material on the front side, a cleaning step to uncover the front side may furthermore be carried out.

Applying the embedding material on the printed circuit board may comprise carrying out a molding process, also referred to as a mold process. The molding process may be carried out with the aid of a molding or mold tool that receives the printed circuit board with the semiconductor chips situated thereon. The molding process may be a transfer molding process, for example, a film assisted transfer molding process (FAM). In this process, a film may be arranged on a tool part of a tool used for the transfer molding. In the transfer molding process, the relevant tool part with the film may be pressed onto the front sides of the semiconductor chips arranged on the printed circuit board. This is associated with sealing the front sides of the semiconductor chips such that it is possible to apply the embedding material in a manner laterally adjoining the semiconductor chips and suppress a front-side covering of the semiconductor chips with the embedding material.

Carrying out the film assisted transfer molding process presupposes that the semiconductor chips comprise the same or approximately the same thickness. In relatively large differences in thickness between semiconductor chips, consideration may be given, if appropriate, to applying a photoresist material on thinner semiconductor chips before the transfer molding process and removing it again from the semiconductor chips after the transfer molding process. In this configuration, the embedding layer produced by the transfer molding may comprise a larger thickness than the thinner semiconductor chips.

Applying the embedding material on the printed circuit board may comprise carrying out a potting process. A circumferential wall, also referred to as a dam, may be formed or arranged on the printed circuit board beforehand that serves as delimitation for enclosing a region provided for the potting.

Forming the contact layers connected to the front-side contacts of the semiconductor chips and may be arranged, inter alia, on the front-side contacts and the embedding layer may comprise carrying out an electrochemical or galvanic deposition. In this example, the following procedure may be adopted.

First, a metallic initial layer may be deposited, for example, by carrying out a sputtering process. A photoresist layer may then be formed on the initial layer and subsequently patterned by exposure and development. In this way, it is possible to predefine freed regions on the initial layer provided to produce the contact layers. The actual electrochemical deposition may subsequently be carried out. In this example, the initial layer serves as a deposition electrode, on which a metallic material is applied. The deposition is carried out in the freed regions in which the initial layer is not covered with the patterned photoresist layer. Afterward, the photoresist layer may be removed and an etching process may be carried out to erode the initial layer outside the contact layers. With the aid of this procedure, all contact layers of the sensors fabricated in an assemblage may be produced in a parallel manner.

Furthermore, it may be appropriate, after forming the embedding layer and before forming the contact layers, to form insulating layers that cover the semiconductor chips on the front side at the edge or in the region of the front-side contacts and also the embedding layer in this region. The contact layers subsequently formed may be arranged partly on the insulating layers. As has been indicated above, an occurrence of short circuits may be avoided with the aid of the insulating layers in this configuration.

Forming the insulating layers may comprise, for example, applying a photoresist layer and patterning same into the insulating layers by exposure and development. With the aid of this procedure, all insulating layers of the sensors fabricated in an assembly may be produced in a parallel manner.

The front-side contacts of the semiconductor chips may electrically connect to contact surfaces of the printed circuit board. This may be carried out directly via the contact layers connected to the front-side contacts of the semiconductor chips, or via the contact layers and further constituents.

For a direct connection, in accordance with a further example, before forming the contact layers, cutouts are formed in the embedding layer, via which contact surfaces of the printed circuit board are at least partly uncovered. Furthermore, the contact layers are formed such that the contact layers connect to the uncovered contact surfaces of the printed circuit board. Forming the cutouts may be carried out, for example, with the aid of a laser.

Before forming the embedding layer, electrical connection elements may be arranged on contact surfaces of the printed circuit board. In this process, the electrical connection elements may connect to the contact surfaces via an electrically conductive connection means. Furthermore, the embedding layer may be formed in a manner laterally adjoining the electrical connection elements. Furthermore, the contact layers are formed such that the contact layers connect to the electrical connection elements. If forming the embedding layer, as indicated above, is carried out with the aid of a film assisted transfer molding process, the film may also be pressed onto the electrical connection elements.

In the method, moreover, further component parts may be formed on the printed circuit board provided with the semiconductor chips, the embedding layer and the contact layers or on a surface constituted by the semiconductor chips, the embedding layer and the contact layers. If appropriate, the surface may in part also be constituted by further constituents, for example, by the above-described insulating layers used to avoid a short circuit. On account of the contact layers, the surface may be relatively planar and comprise a small topography. This affords the possibility of applying corresponding materials to form further component parts using cost-effective processes. It is possible, for example, to implement metering with the aid of a dispenser (dispensing), applying droplets with the aid of a printing device (jetting) or spraying (spraycoating). Time-consuming and cost-intensive processes, for example, placement of individual elements such as individual frames, for example, may thus be obviated. The following configurations may be appropriate with regard to forming further component parts.

A radiation-transmissive material to form optical elements may be applied on the printed circuit board provided with the semiconductor chips, the embedding layer and the contact layers. The radiation-transmissive material may be applied in liquid or viscous form and subsequently cure. The radiation-transmissive material may be a plastics material such as a clear epoxy or silicone material, for example, or comprise such a material. Applying the radiation-transmissive material, which may be carried out by dispensing, for example, may be carried out in the region of all or a portion of the semiconductor chips.

By way of example, optical elements may be formed in the form of lenses comprising a curved lens surface. The lens shape may be set by thixotropy, for example. This exploits the fact that the radiation-transmissive material may comprise a higher viscosity after application than during application associated with a mechanical stress. What may be achieved in this way is that a lens shape present after application is maintained. For this property, the radiation-transmissive material may additionally comprise a suitable filler. To define the lens shape, additionally or alternatively, overhead curing is also possible, that is to say curing with an orientation of the printed circuit board in which the radiation-transmissive material is directed downward. In this example, the lens shape may be set by the influence of gravitation or a lens shape already present after application may be maintained.

It is furthermore possible to carry out the process of forming optical elements with the aid of a molding process. In this way, too, it is possible to produce optical elements with a lens shape. The molding process may be a UV molding process. In such a configuration, a UV-curing plastics material that may be solidified with the aid of UV radiation (ultraviolet radiation) may be used as radiation-transmissive material to form the optical elements. Furthermore, a tool used in the molding process and in which the printed circuit board provided with the semiconductor chips, the embedding layer and the contact layers may be received may comprise a tool part transmissive to UV radiation and comprises cavities coordinated with the optical elements to be produced. The radiation-transmissive material may be applied on the printed circuit board provided with the semiconductor chips, the embedding layer and the contact layers and may then be pressed to shape with the aid of said tool part. Alternatively, the radiation-transmissive material may be introduced into the cavities of the tool part and be applied with the aid of the tool part on the printed circuit board provided with the semiconductor chips, the embedding layer and the contact layers. These steps may be carried out in a liquid or viscous state of the radiation-transmissive material. Curing may then be carried out by irradiating the radiation-transmissive material with UV radiation through the tool part.

A radiation-nontransmissive material to form at least one radiation-nontransmissive barrier structure may be applied on the printed circuit board provided with the semiconductor chips, the embedding layer and the contact layers. This example may be considered if sensors comprising at least one radiation-detecting semiconductor chip and at least one radiation-emitting semiconductor chip are produced with the aid of the method. Crosstalk between a radiation-emitting semiconductor chip and a radiation-detecting semiconductor chip may be suppressed with the aid of a barrier structure.

It is possible to form a contiguous barrier structure or a plurality of barrier structures that may be severed and thus distributed among a plurality of sensors in the singulating step. In this regard, by way of example, a plurality of linear barrier structures or one lattice-shaped barrier structure may be formed. Relative to a plan view consideration of the printed circuit board provided with the semiconductor chips and the embedding layer, the at least one barrier structure may be formed in regions or at least partly in regions located between radiation-detecting and radiation-emitting semiconductor chips.

The radiation-nontransmissive material may be applied in the form of at least one barrier structure. In this example, the radiation-nontransmissive material may be applied in liquid or viscous form and then cured. In this configuration, by way of example, a black epoxy or silicone material may be used as radiation-nontransmissive material. Applying may be carried out by dispensing or jetting, for example. Applying may be carried out in elongate or linear applying regions, for example. Lattice-shaped applying is also possible, for example.

Alternatively, it may be appropriate to apply the radiation-nontransmissive material in the form of a continuous layer and then to pattern the layer into the at least one barrier structure. With regard to this configuration, by way of example, a layer comprising a black photoresist material may be applied by printing or laminating, for example, and be patterned by exposure and development.

It is furthermore possible to produce sensors comprising both optical elements and one or a plurality of barrier structures. In this context, first, optical elements and then at least one barrier structure may be formed on the printed circuit board provided with the semiconductor chips, the embedding layer and the contact layers. An opposite order of these steps is also possible.

Furthermore, consideration may be given, if appropriate, after producing at least one barrier structure, to applying a radiation-transmissive material in the form of a planar layer in regions between sections of the barrier structure or in regions between a plurality of barrier structures.

A radiation-transmissive cover may be arranged on the radiation-nontransmissive material. This configuration may be appropriate if the radiation-nontransmissive material, as indicated above, is applied directly in the form of at least one barrier structure. In this configuration, the cover may be positioned on the radiation-nontransmissive material before the latter is cured, and may be secured owing to the curing of the radiation-nontransmissive material. The cover may be laminar and formed from a glass or plastics material. Furthermore, the cover may be severed in the singulating process and thus distributed among a plurality of sensors.

With regard to the example described above, consideration may be given, if appropriate, to providing ventilation holes extending through the printed circuit board and the embedding layer. This makes it possible to avoid a situation in which, as a result of arranging the cover, closed cavities are formed and contamination of the cover occurs in this way as a result of outgassing of the radiation-nontransmissive material.

A radiation-transmissive material to form a radiation-transmissive layer may be applied on the printed circuit board provided with the semiconductor chips, the embedding layer and the contact layers. The radiation-transmissive material may be a clear epoxy or silicone material, for example. Furthermore, applying the radiation-transmissive material may be carried out by spray coating or film lamination, for example.

At least one trench structure may subsequently be formed in the radiation-transmissive layer. This may be carried out, for example, in a mechanical manner, for example, by sawing, or using a laser, for example. Furthermore, a radiation-nontransmissive material to form a radiation-nontransmissive barrier structure is applied in the region of the trench structure, for example by dispensing.

It is also possible for the radiation-transmissive layer to be configured in patterned form with at least one trench structure. By way of example, a process of applying a radiation-transmissive material by spraying using a shadow mask comprising cutouts may be employed for this purpose. Afterward, a radiation-nontransmissive material to form a radiation-nontransmissive barrier structure may be applied in the region of the trench structure. This may be carried out, for example, by dispensing, or with the aid of a spraying process using a further shadow mask.

The advantageous configurations and developments explained above may be applied individually or else in any desired combination with one another—apart, for example, in examples of clear dependencies or incompatible alternatives.

The above-described properties, features and advantages and the way in which they are achieved will become clearer and more clearly understood in association with the following description of examples that are explained in greater detail in association with the schematic drawings.

Possible configurations of optical sensors 100 and associated production methods are described with reference to the following schematic figures. The sensors 100 comprise at least one radiation-detecting semiconductor chip 122. In the context of production, processes known from semiconductor technology and from the fabrication of sensors and optoelectronic components may be carried out and routine materials in these fields may be used. They will thus be discussed only in part. In the same way, in addition to processes shown and described, further processes may be carried out and the sensors 100 may be fabricated with further component parts and structures in addition to component parts shown and described. It is furthermore pointed out that the figures are merely of schematic nature and are not true to scale. In this sense, component parts and structures shown in the figures may be illustrated with exaggerated size or size reduction to afford a better understanding.

FIGS. 1 to 8 show one possible method of producing sensors 100 on the basis of lateral sectional illustrations. In this example, each sensor 100 comprises a radiation-emitting semiconductor chip 121 and a radiation-detecting semiconductor chip 122. The sensors 100 may be combined proximity and ambient light sensors which may be used both to detect objects and measure a brightness of the ambient light. FIG. 9 supplementarily shows a plan view illustration of a sensor 100 fabricated in accordance with the method from FIGS. 1 to 8.

The method involves fabricating a contiguous assemblage comprising a plurality of sensors subsequently singulated into the separate sensors 100. FIGS. 1 to 4, 7 and 8 each show an excerpt substantially in the region of one of the sensors 100 to be produced. The conditions illustrated here may be present in a manner repeating multiply next to one another in a plane. For better elucidation, a repetition grid is indicated on the basis of dashed lines 200 in the relevant figures. Severing to singulate the sensor assemblage is also carried out at the lines 200 (cf. FIG. 8). The lines 200 are therefore referred to hereinafter as separating lines 200.

The method involves providing a carrier plate 110 as shown as an excerpt in FIG. 1. The printed circuit board 110 comprises an electrically insulating material 114 and electrical conductor structures 116. The insulating material 114 may be an FR4 material or a BT material, for example. The conductor structures 116 may be formed from a metallic material such as copper, for example. The conductor structures 116 comprise contact surfaces 117, 118 arranged at two opposite main sides of the printed circuit board 110 and are freely accessible and thereby contactable at the main sides. The side directed toward the top in the figures is a front side, and the side directed toward the bottom is a rear side of the printed circuit board 110. Accordingly, hereinafter the contact surfaces 117 are also referred to as front-side contact surfaces 117 and the other contact surfaces 118 are also referred to as rear-side contact surfaces 118.

As illustrated in FIG. 1, each conductor structure 116 may comprise a front-side contact surface 117 and a rear-side contact surface 118. Furthermore, the conductor structures 116 comprise constituents extending through the printed circuit board 110 and arranged within the printed circuit board 110. These are vertical plated-through holes and conductive layers. In this way, the front- and rear-side contact surfaces 117, 118 of the conductor structures 116 electrically connect to one another.

For reasons of clarity, FIG. 1 illustrates a construction for the printed circuit board 110 in which all constituents of the conductor structures 116 shown are present in the same sectional plane. However, the printed circuit board 110 may also be formed such that individual conductor structures 116 and/or constituents of conductor structures 116 are located in sectional planes offset with respect to one another.

Figure 2:
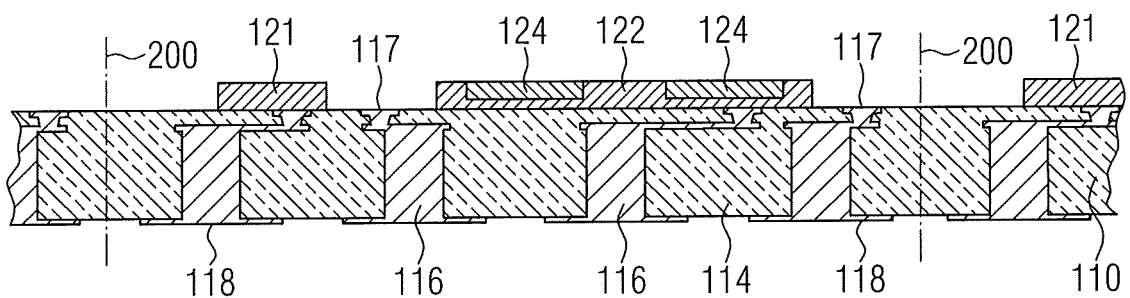

In a further step of the method as shown in FIG. 2, semiconductor chips 121, 122 are mounted on the front side of the printed circuit board 110. The semiconductor chips 121, 122 comprise a rear-side contact, not illustrated, and a front-side contact 125 shown only in FIGS. 5 and 6. The semiconductor chips 121, 122 may be electrically contacted via the contacts. In the context of chip mounting, the semiconductor chips 121, 122 may electrically connect to front-side contact surfaces 117 of the printed circuit board 110 via the rear-side contacts of the semiconductor chips and an electrically conductive connection means, not illustrated. The connection means may be, for example, an electrically conductive adhesive (for example, a silver conductive adhesive), a solder or a sintering paste (for example, a silver sintering paste).

For each sensor 100 to be produced, a radiation-emitting semiconductor chip 121 and a radiation-detecting semiconductor chip 122 are arranged on the printed circuit board 110 (cf. FIGS. 2 and 9). The radiation-emitting semiconductor chips 121, also called emitters 121 hereinafter, may be configured to emit infrared light radiation. The radiation-detecting semiconductor chips 122, also called detectors 122 hereinafter, may comprise a plurality of or two detection regions 124. The detection regions 124 of the detectors 122 may be configured to detect radiation in different wavelength ranges. In this example, one detection region 124 may be configured to detect visible light radiation, and the other detection region 124 may be configured to detect the infrared light radiation emitted by an emitter 121 and reflected at an object. In this way, the sensors 100 produced with the aid of the method are suitable for detecting objects and measuring the brightness of the ambient light.

The emitters 121 may be LED chips (Light Emitting Diode), for example. The detectors 122 may be photodiode chips, for example. In this example, the detection regions 124 of the detectors 122 may be realized in the form of photodiode structures.

Figure 3:
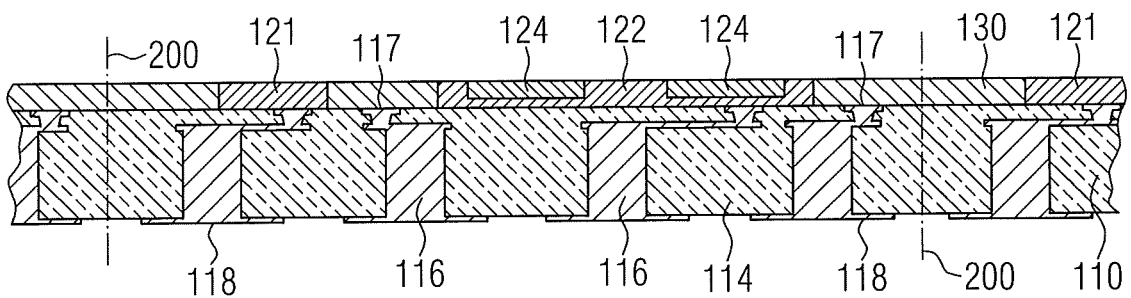

After chip mounting as shown in FIG. 3, an insulating embedding material is applied on the front side of the printed circuit board 110. An embedding layer 130 laterally adjoining the semiconductor chips 121, 122 and circumferentially enclosing the semiconductor chips 121, 122 is formed as a result. The embedding material of the embedding layer 130 may be a plastics material that may be applied in liquid or viscous form and then cured. The plastics material may be an epoxy material, for example. A further example is a hybrid material comprising a mixture of an epoxy material and a silicone material. The embedding material may furthermore contain a particulate filler. Furthermore, the embedding material may comprise a black or white color, for example.

As illustrated in FIG. 3, the embedding layer 130 may be formed such that the embedding layer 130 extends as far as front sides of the semiconductor chips 121, 122 and the front sides of the semiconductor chips 121, 122 are free of the embedding layer 130. For this purpose, by way of example, a film assisted transfer molding process may be carried out. In this example, on a tool part of a tool used for the transfer molding and in which the printed circuit board 110 provided with the semiconductor chips 121, 122 is received, a film is arranged (not illustrated). In the transfer molding process, this tool part with the film is pressed onto the front sides of the semiconductor chips 121, 122. This leads to a sealing of the front sides of the semiconductor chips 121, 122, as a result of which it is possible to apply the embedding material on the printed circuit board 110 in a manner laterally adjoining the semiconductor chips 121, 122 and to avoid a front-side covering of the semiconductor chips 121, 122 with the embedding material.

A prerequisite for the procedure described above is that the semiconductor chips 121, 122 arranged on the printed circuit board 110 comprise the same or substantially the same thickness, for example, with a tolerance in the region of 5 µm. Such thickness fluctuations may be compensated for with the aid of the film.

In larger differences in thickness of, for example, 10 µm to 25 µm, the following procedure may be adopted. In this example, a photoresist material may be applied on lower semiconductor chips before the transfer molding process and may be removed again from the relevant semiconductor chips after the transfer molding process, for example, by wet-chemical stripping. In this way, the embedding layer 130 arranged on the printed circuit board 110 may comprise a larger thickness than the lower semiconductor chips and thus project beyond the lower semiconductor chips (not each illustrated).

Applying the embedding material to form the embedding layer 130 circumferentially enclosing the semiconductor chips 121, 122 may also be carried out in some other way. By way of example, it is possible to carry out a potting process. Before the process of potting the embedding material, a circumferential wall, also referred to as a dam, may be formed or arranged on the printed circuit board 110. The wall may serve as a delimitation to enclose a region provided for the potting on the printed circuit board 110 (not each illustrated).

If semiconductor chips 121, 122 are covered with the embedding material on the front side in an undesired manner after the process of forming the embedding layer 130, it is furthermore possible to carry out a cleaning step (deflashing) for uncovering covered semiconductor chips 121, 122 (not illustrated).

Figure 4:
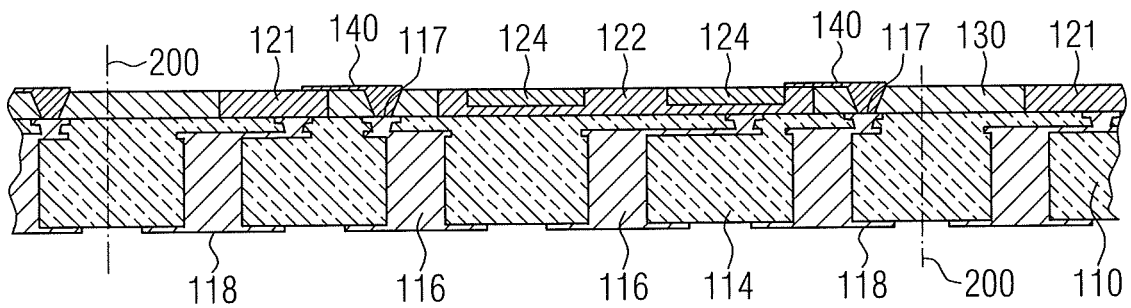

After forming the embedding layer 130, the front-side contacts 125 of the semiconductor chips 121, 122 are electrically connected to further front-side contact surfaces 117 of the printed circuit board 110. This step comprises, inter alia as shown in FIG. 4, forming contact layers 140 serving as conductor tracks.

Figure 5:
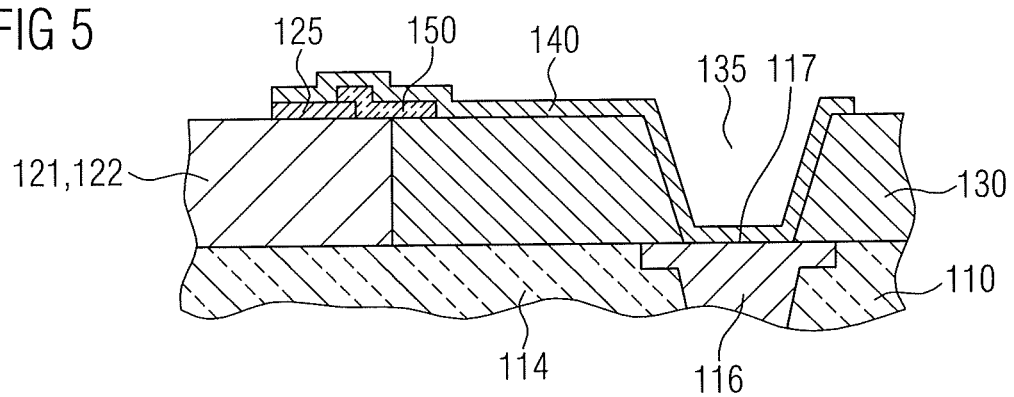

For better elucidation of a possible procedure explained below, FIG. 5 shows an enlarged lateral illustration of the printed circuit board 110 in the region of a semiconductor chip 121 or 122, respectively. This illustration may be applied with regard to all semiconductor chips 121, 122 arranged on the printed circuit board 110.

To produce electrical connections between the front-side contacts 125 of the semiconductor chips 121, 122 and front-side contact surfaces 117 of the printed circuit board 110, first, it is possible to form cutouts 135 in the embedding layer 130 via which the relevant contact surfaces 117 are at least partly freed (cf. FIG. 5). For this purpose, by way of example, a laser may be used (not illustrated).

Afterward, insulating layers 150 may be formed that cover the semiconductor chips 121, 122 at the edge in the region of the front-side contact 125 and also the embedding layer 130 in this region (cf. FIG. 5). For this purpose, by way of example, a photoresist layer may be applied and patterned into the insulating layers 150 by exposure and development (not illustrated). With the aid of the insulating layers 150, it is possible to prevent the front-side contacts 125 of the semiconductor chips 121, 122 from being short-circuited with sidewalls of the semiconductor chips 121, 122 via the contact layers 140 subsequently formed.

The contact layers 140 may subsequently be formed such that the front-side contacts 125 of the semiconductor chips 121, 122 electrically connect via the contact layers 140 to the contact surfaces 117 freed via the cutouts 135 of the embedding layer 130 (cf. FIG. 5). This may be carried out as follows.

At the beginning, a metallic initial layer may be deposited by sputtering, for example. Afterward, a photoresist layer may be formed on the initial layer and be patterned by exposure and development. In this way, it is possible to predefine freed regions on the initial layer provided to produce the contact layers 140. An electrochemical or galvanic deposition may subsequently be carried out. In this example, the initial layer may serve as a deposition electrode on which metallic material is deposited in the freed regions not covered with the photoresist layer to form the contact layers 140. Afterward, the photoresist layer may be removed and an etching process may be carried out to remove the initial layer outside the contact layers 140 (not each illustrated).

As illustrated in FIG. 5 on the basis of a semiconductor chip 121, 122, the contact layers 140 may be arranged on the semiconductor chips 121, 122 or on the front-side contacts 125 thereof, the insulating layers 150, the embedding layer 130 and the freed contact surfaces 117. The contact layers 140 may furthermore be formed such that the contact layers 140 cover the embedding layer 130 completely within the cutouts 135, and outside the cutouts 135 in an edge region extending around the cutouts 135.

Figure 6:
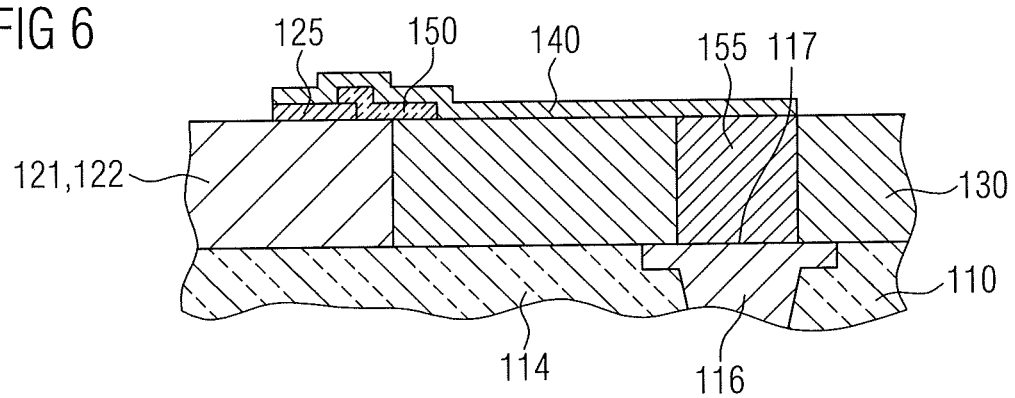

It is possible for the front-side contacts 125 of the semiconductor chips 121, 122 not to electrically connect to front-side contact surfaces 117 of the printed circuit board 110 exclusively via contact layers 140 deposited electrochemically. For better elucidation of a further procedure explained below, FIG. 6 shows a further enlarged lateral illustration of the printed circuit board 110 in the region of a semiconductor chip 121 or 122, respectively. This illustration, too, may be applied with regard to all semiconductor chips 121, 122 arranged on the printed circuit board 110.

To produce electrical connections between the front-side contacts 125 of the semiconductor chips 121, 122 and front-side contact surfaces 117 of the printed circuit board 110, it is possible, alternatively, before forming the embedding layer 130, to arrange electrical connection elements 155 on contact surfaces 117 of the printed circuit board 110 (cf. FIG. 6). The electrical connection elements 155 may comprise a thickness corresponding or substantially corresponding to the semiconductor chips 121, 122. The electrical connection elements 155 may be configured, for example, in the form of bodies comprising a metallic material. In a further possible configuration, the electrical connection elements 155 are realized in the form of bodies comprising silicon with a metallization, for example. Moreover, the electrical connection elements 155 may be a parallelepipedal design, for example. Furthermore, the electrical connection elements 155 may be mounted together with the semiconductor chips 121, 122 on the printed circuit board 110. In the course of mounting, the electrical connection elements 155 may connect to the corresponding contact surfaces 117 via an electrically conductive connection means, not illustrated, for example, an electrically conductive adhesive, a solder or a sintering paste.

The embedding layer 130 subsequently formed may laterally adjoin the electrical connection elements 155 and circumferentially enclose the electrical connection elements 155, like the semiconductor chips 121, 122. If forming the embedding layer 130, as indicated above, is carried out with the aid of a film assisted transfer molding process, the tool part provided with the film may be pressed onto the electrical connection elements 155 for front-side sealing. When electrical connection elements 155 are covered with the embedding material on the front side in an undesired manner after the process of forming the embedding layer 130, the electrical connection elements may likewise be uncovered in the context of the cleaning step mentioned above (not illustrated in each case).

Afterward, it is possible to form the insulating layers 150 in the region of the semiconductor chips 121, 122, and subsequently the contact layers 140. Forming the contact layers 140 may be carried out such that the contact layers 140 are arranged on the semiconductor chips 121, 122 or on the front-side contacts 125 thereof, the insulating layers 150, the embedding layer 130 and the electrical connection elements 155 (cf. FIG. 6). As a result, the front-side contacts 125 of the semiconductor chips 121, 122 electrically connect to corresponding front-side contact surfaces 117 of the printed circuit board 110 not just via the contact layers 140, but additionally via the electrical connection elements 155. Forming the insulating layers 150 and the contact layers 140 may be carried out as described above.

The process sequences described above afford the possibility of forming all insulating layers 150 and all contact layers 140 in a parallel manner. In this way, the method may be carried out cost-effectively.

On account of the contact layers 140, the sensors 100 produced with the aid of the method may furthermore comprise a small structural height. This proves to be expedient with regard to possible applications, not shown, of the sensors 100 in mobile devices. Furthermore, a high durability of contact layers 140 is advantageous, with the result that the sensors 100 may comprise a high reliability and lifetime.

Furthermore, a subsequent process of forming further component parts may be fostered by the use of the contact layers 140. Component parts of this type may be formed on a surface constituted by the semiconductor chips 121, 122, the embedding layer 130, the insulating layers 150 and the contact layers 140. On account of the contact layers 140, the surface may be relatively planar and comprise a small topography. As a result, it is possible to form further component parts thereon using cost-effective processes.

Figure 7:
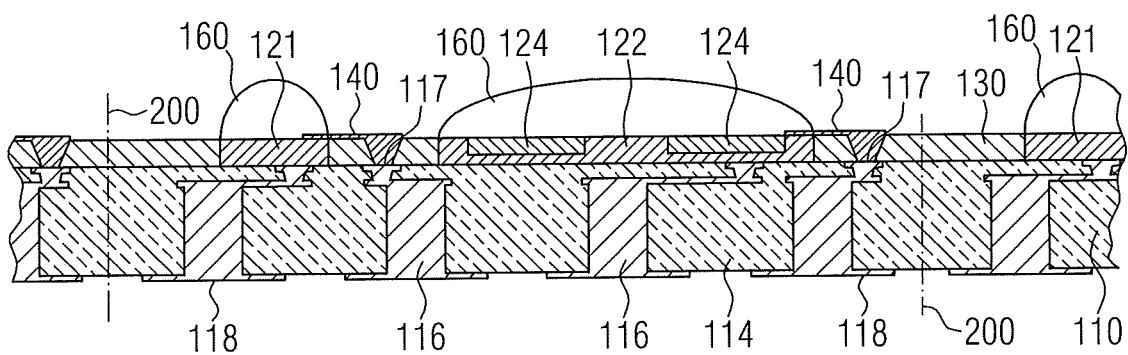

As shown in FIG. 7, radiation-transmissive optical elements 160 are formed on the printed circuit board 110 provided with the semiconductor chips 121, 122, the embedding layer 130 and the contact layers 140. The optical elements 160 are realized in the form of lenses comprising a curved lens surface. One such optical element 160 is provided on each of the semiconductor chips 121, 122. The optical elements 160 arranged on the different semiconductor chips 121, 122 comprise different lateral dimensions and different shapes. In an emitter 121, a shaping of the radiation emitted by the emitter 121 may be achieved with the aid of an associated optical element 160. In a detector 122, the associated optical element 160 may bring about a shaping of the radiation received by the detector 122.

To form the optical elements 160, a radiation-transmissive material may be applied in the region of the semiconductor chips 121, 122. The radiation-transmissive material may be applied in liquid or viscous form and then cured. The radiation-transmissive material may be a transparent plastics material, for example, a clear epoxy or silicone material. Applying may be carried out, for example, by metering with the aid of a dispenser (not illustrated).

The lens shape of the optical elements 160 may be established by thixotropy, for example. This exploits the fact that the radiation-transmissive material may comprise a higher viscosity after application than during application, wherein the radiation-transmissive material is subject to a mechanical stress. This property may be realized by a configuration of the radiation-transmissive material comprising a suitable particulate filler. What may be achieved in this way is that a lens shape present after application is maintained.

To define the lens shape, additionally or alternatively, consideration may be given to overhead curing after applying the radiation-transmissive material. For this purpose, the printed circuit board 110 is brought to an orientation termed upside down in contrast to FIG. 7 such that the radiation-transmissive material is directed downward. In this way, the lens shape may be set by the influence of gravitation or a lens shape already present may be maintained (not each illustrated).

Figure 8:
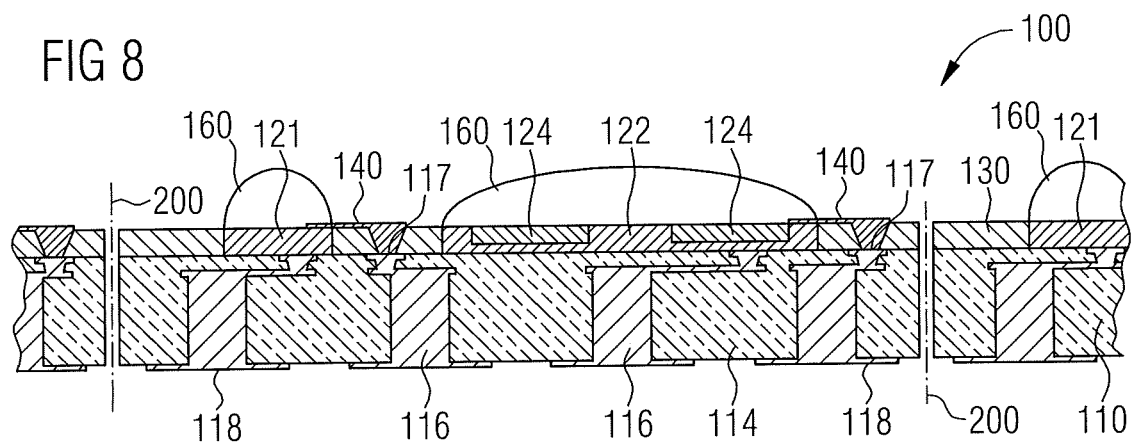
Figure 9:
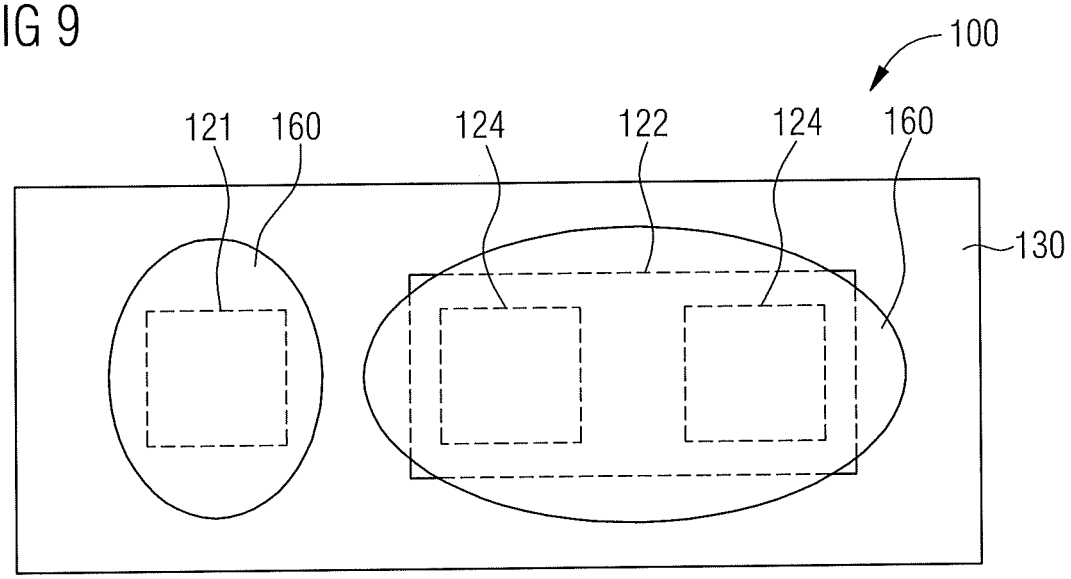
FIG. 9 shows a plan view illustration of a sensor produced by the method from FIGS. 1 to 8.

After forming the optical elements 160 as shown in FIG. 8, a singulating process is carried out to subdivide the sensor assemblage comprising the printed circuit board 110 provided with the semiconductor chips 121, 122, the embedding layer 130, the contact layers 140 and the optical elements 160 into separate sensors 100. The singulating involves severing the printed circuit board 110 and the embedding layer 130 along the separating lines 200 and may be carried out by sawing, for example. Each sensor 100 comprises a section of the printed circuit board 110, a section of the embedding layer 130, an emitter 121, a detector 122 and optical elements 160 assigned to the emitter 121 and the detector 122. The rear-side contacts and front-side contacts of the semiconductor chips 121, 122 connect to front-side contact surfaces 117 of the associated printed circuit board sections and may therefore be electrically contacted via the rear-side contact surfaces 118. An electrical energy supply and, in the detectors 122, tapping off detector signals are possible as a result.

FIG. 9 supplementarily shows a plan view illustration of a sensor 100 produced in accordance with the method described above. With reference to FIG. 9, it becomes clear that the optical elements 160, in a departure from FIGS. 7 and 8, may be formed with somewhat larger lateral dimensions. As a result, the optical elements 160 may also be arranged laterally with respect to the semiconductor chips 121, 122 on the embedding layer 130.

Further variants and modifications are described below, which may be considered for optical sensors 100 and an associated production method. Corresponding features, method steps and aspects and also identical and identically acting component parts are not described in detail again below. Instead, for details in respect thereof, reference is made to the description above. Furthermore, aspects and details mentioned with regard to one configuration may also be applied with regard to another configuration and features of two or more configurations may be combined with one another.

It is possible, for example, to form sensors 100 comprising one or a plurality of radiation-nontransmissive barrier structures 170. The nontransmissivity relates to the radiation or light radiation emitted by an emitter 121. Such light-blocking barrier structures 170 may be formed like the optical elements 160 on the printed circuit board 110 provided with the semiconductor chips 121, 122, the embedding layer 130 and the contact layers 140. Crosstalk between the emitter 121 and the detector 122 of a sensor 100 may be suppressed in such a configuration. This means that it is possible to at least partly prevent the light radiation emitted by the emitter 121 from passing to the detector 122 without a predefined interaction or reflection of the light radiation emitted by the emitter 121 taking place beforehand.

Figure 10:
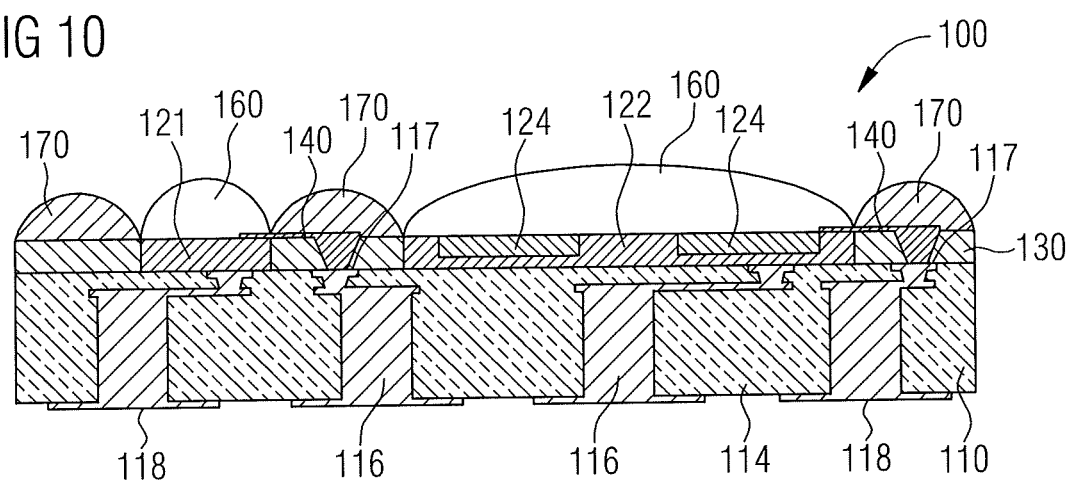
FIGS. 10 and 11 show a lateral illustration and a plan view illustration of a further sensors comprising separate light-blocking barrier structures.
Figure 11:
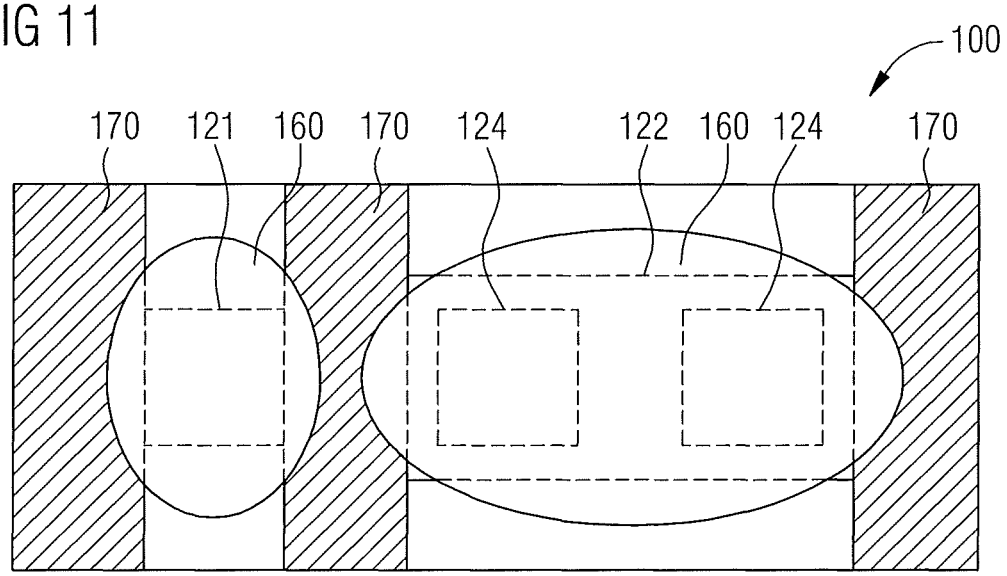

For exemplary elucidation, FIGS. 10 and 11 show a lateral illustration and a plan view illustration of a sensor 100 realized in this way. This sensor 100 may correspondingly be a combined proximity and ambient light sensor. Compared to the design shown in FIGS. 8 and 9, the sensor 100 illustrated in FIGS. 10 and 11 additionally comprises three elongate or web-shaped light-blocking barrier structures 170. The barrier structures 170 are arranged like the optical elements 160 on the surface constituted by the semiconductor chips 121, 122, the embedding layer 130, the insulating layers 150 and the contact layers 140. Relative to a plan view consideration of the sensor 100, two barrier structures 170 are located at opposite ends of the sensor 100 and thus laterally next to the emitter 121 and laterally next to the detector 122, and a central barrier structure 170 is present in a region between the semiconductor chips 121, 122 (cf. FIG. 11). The above-described suppression of crosstalk may principally be achieved with the aid of the central barrier structure 170.

To produce sensors 100 comprising the construction shown in FIGS. 10 and 11, first, the procedure as described above is adopted to provide the arrangement shown in FIG. 4, i.e. the printed circuit board 110 provided with the semiconductor chips 121, 122, the embedding layer 130 and the contact layers 140. Afterward, a radiation-nontransmissive material to form the barrier structures 170 is applied on the arrangement.

It is possible to apply the radiation-nontransmissive material in the form of the barrier structures 170 to be produced, that is to say in this example in the form of parallel elongate sections or lines. The barrier structures 170 produced in this way may initially still be assigned to a plurality of the sensors 100 to be produced and therefore extend over the regions of a plurality of sensors 100 (not illustrated). By way of example, a black epoxy or silicone material may be used as radiation-nontransmissive material. Such a material may be applied in liquid or viscous form and then cured. Applying may be carried out by dispensing, for example. A further possible process is applying droplets with the aid of a printing device (jetting). On account of these processes, the barrier structures 170 may comprise a curved surface in cross section as shown in FIG. 10.

Afterward, optical elements 160 are formed on the printed circuit board 110 provided with the semiconductor chips 121, 122, the embedding layer 130, the contact layers 140 and the barrier structures 170. This is carried out in the manner described above. In a departure from FIG. 10, the optical elements 160 may in part also be arranged on the barrier structures 170 as indicated in FIG. 11. The sensor assemblage present after forming the optical elements 160 is subsequently singulated into separate sensors 100 comprising the construction shown in FIGS. 10 and 11. The singulating process also involves severing barrier structures 170 that are initially assigned to a plurality of sensors 100, the barrier structures in this respect being distributed among individual sensors 100.

Further sensors 100 that may likewise be combined proximity and ambient light sensors are described with reference to FIGS. 12 to 16.

Figure 12:
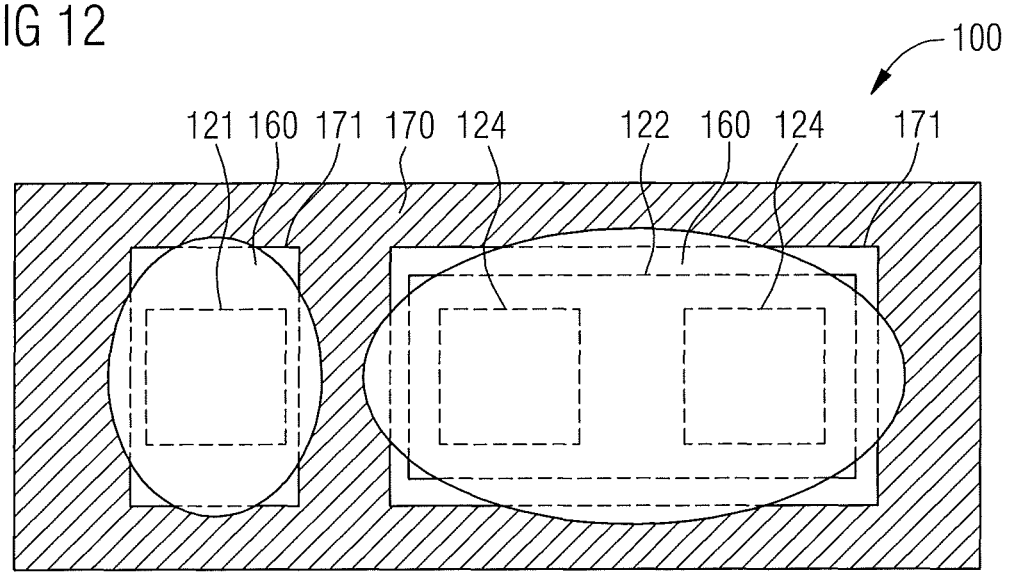
FIG. 12 shows a plan view illustration of a further sensor comprising a contiguous light-blocking barrier structure.

FIG. 12 shows a plan view illustration of a further sensor 100 that, in contrast to the design shown in FIG. 11, comprises a contiguous light-blocking barrier structure 170 instead of separate barrier structures 170. Relative to a plan view consideration, the barrier structure 170 comprises a configuration each extending in a frame-shaped fashion around the emitter 121 and the detector 122 of the sensor 100. In this example, the barrier structure 170 comprises two recesses 171 coordinated with the semiconductor chips 121, 122, via which the semiconductor chips 121, 122 are freed. The optical elements 160 are formed in the region of the recesses 171 of the barrier structure 170, and in part also arranged on the barrier structure 170. In cross section, the sensor 100 may comprise a configuration comparable to FIG. 10.

To produce sensors 100 comprising the construction shown in FIG. 12, the procedure as described above may be adopted. The frame shape shown in FIG. 12 may be realized by applying the radiation-nontransmissive material in the form of a cross-shaped lattice on the printed circuit board 110 provided with the semiconductor chips 121, 122, the embedding layer 130 and the contact layers 140, and thus forming a lattice-shaped barrier structure 170 comprising a multiplicity of recesses 171 and assigned to all the sensors 100 to be produced (not illustrated). In the singulating process, the barrier structure 171 is divided into barrier structures 170 comprising the shape shown in FIG. 12.

Figure 13:
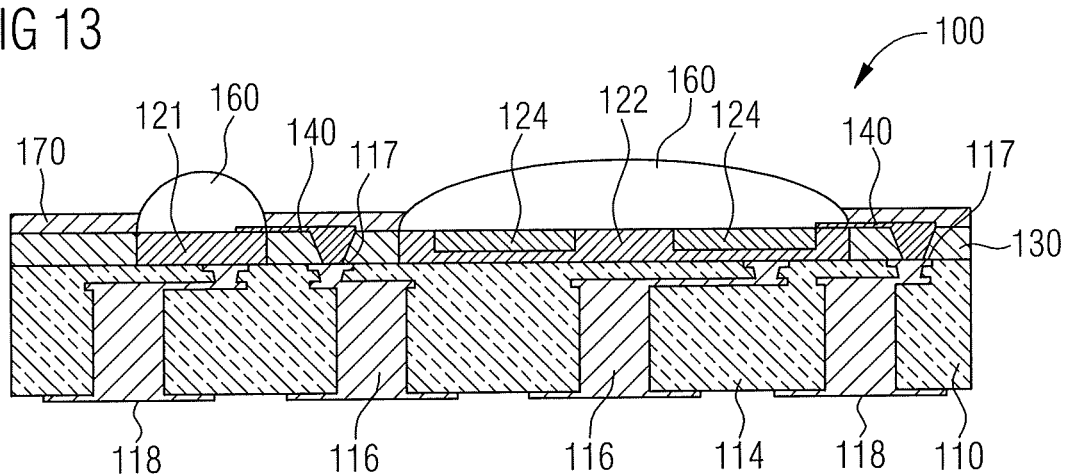
FIGS. 13 and 14 show a lateral illustration and a plan view illustration of a further sensor comprising a continuous barrier structure.
Figure 14:
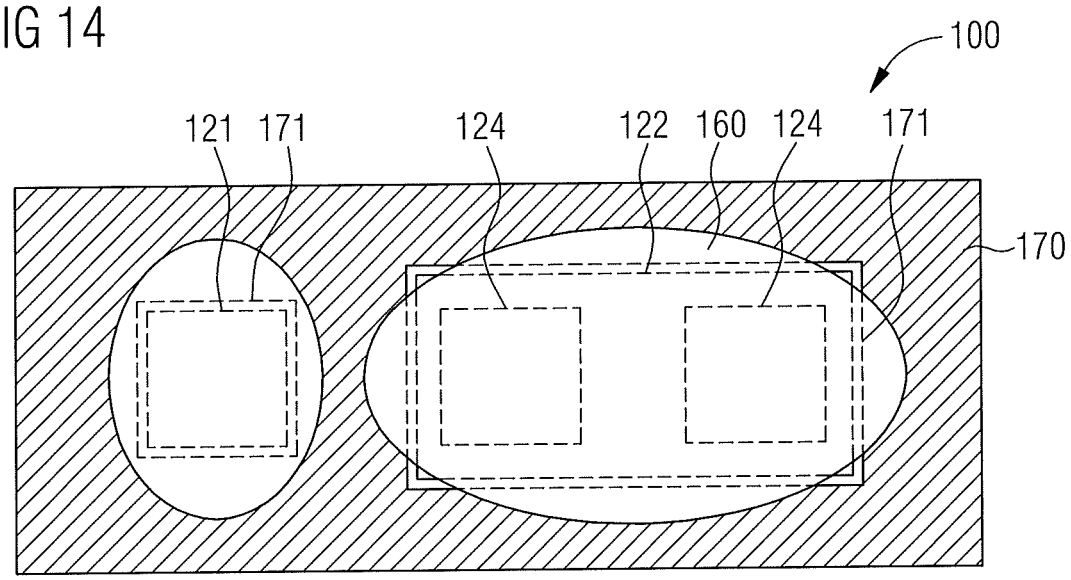

FIGS. 13 and 14 show a lateral illustration and a plan view illustration of a further sensor 100 comprising a continuous barrier structure 170 comprising recesses 171 coordinated with the semiconductor chips 121, 122 of the sensor 100. The barrier structure 170 comprises a planar shape in cross section as shown in FIG. 13.

To produce sensors 100 comprising the construction shown in FIGS. 13 and 14, this likewise first involves providing the arrangement shown in FIG. 4. Afterward, a continuous layer comprising a black photoresist material is applied on the arrangement, for example, by printing or laminating. This may involve a solder resist material. The black photoresist layer may comprise a layer thickness of 30 µm to 50 µm. Afterward, the photoresist layer is patterned by exposure and development to constitute therefrom a lattice-shaped barrier structure 170 comprising a multiplicity of recesses 171 freeing the semiconductor chips 121, 122 (not illustrated).

Afterward, optical elements 160 are formed on the printed circuit board 110 provided with the semiconductor chips 121, 122, the embedding layer 130, the contact layers 140 and the lattice-shaped barrier structure 170, specifically in the region of the recesses 171 of the barrier structure 170. In a departure from FIG. 13, the optical elements 160 may in part also be arranged on the barrier structure 170 as indicated in FIG. 14. In the subsequent singulating process, the lattice-shaped barrier structure 170 is divided into barrier structures 170 comprising the shape shown in FIG. 14.

It is possible for a process of applying a radiation-nontransmissive material to form one or a plurality of barrier structures 170 to be carried out, in a departure from the method sequences described above, not until after a process of forming optical elements 160. In this context, by way of example, the method sequences explained above with reference to FIGS. 10 to 12 may be modified such that the radiation-nontransmissive material used to form the barrier structure(s) 170 is applied next to and between the optical elements 160 formed beforehand.

Figure 15:
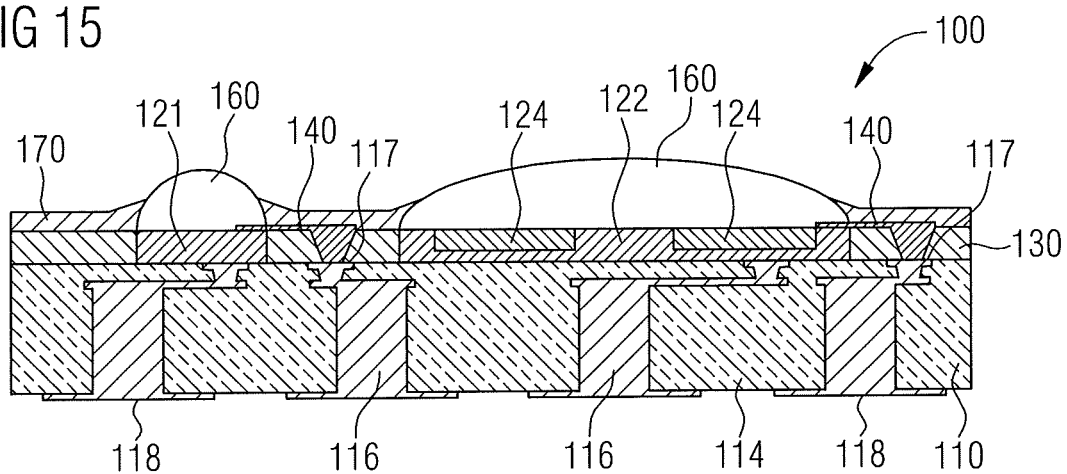
FIGS. 15 and 16 show a lateral illustration and a plan view illustration of a further sensor comprising a continuous barrier structure.
Figure 16:
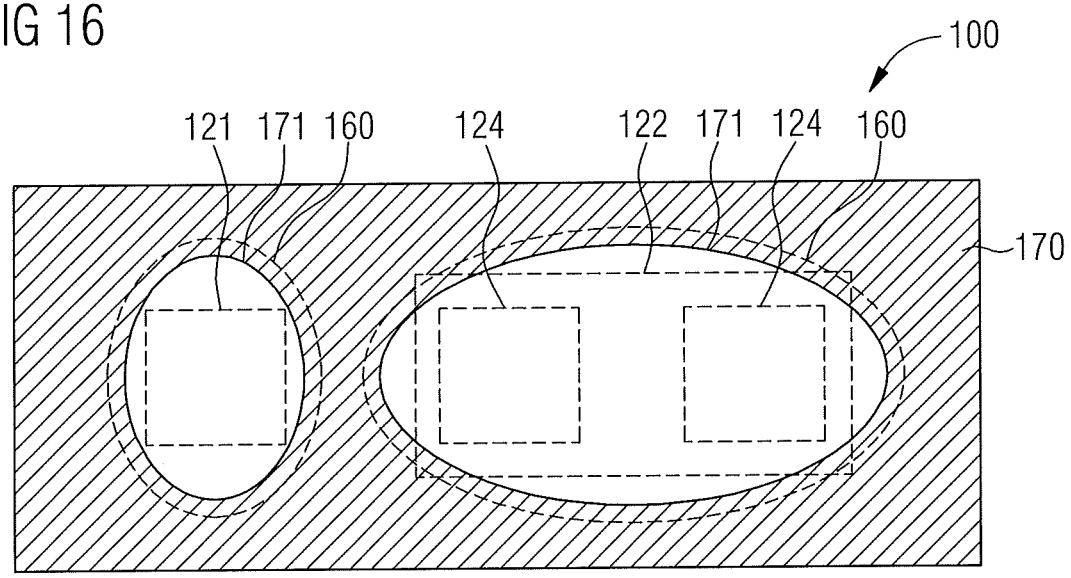

Furthermore, in this way it is possible to produce sensors 100 in which the barrier structure(s) 170 is/are arranged in part on the optical elements 160. For exemplary elucidation, FIGS. 15 and 16 show a lateral illustration and a plan view illustration of a further sensor 100 produced in this manner. The sensor 100 comprises a continuous barrier structure 170 comprising recesses 171 that covers the optical elements 160 at the edge.

To produce sensors 100 comprising the construction shown in FIGS. 15 and 16, first, the procedure as described above is adopted to provide the arrangement comprising the optical elements 160 as shown in FIG. 7. A radiation-nontransmissive material is applied on the arrangement in regions next to and between the optical elements 160. The radiation-nontransmissive material may be a black epoxy or silicone material, for example, and applied by dispensing or jetting, for example. In this example, the radiation-nontransmissive material may wet the optical elements 160 at the edge. The barrier structure 170 present after curing comprises a multiplicity of recesses 171 such that the optical elements 160 are freed in these regions (not illustrated). In the subsequent singulating process, the barrier structure 170 is severed and thus distributed among individual sensors 100.

With regard to the method sequence described above, consideration may alternatively be given to applying the radiation-nontransmissive material in the form of parallel elongate sections or lines such that linear barrier structures 170 are formed, which may cover the optical elements 160 at the edge (not illustrated). These barrier structures 170, too, may initially still be assigned to a plurality of the sensors 100 to be produced, and may be severed and distributed among individual sensors 100 in the singulating process (not illustrated).

The method may furthermore be carried out such that sensors 100 comprising a different number of semiconductor chips are produced. Furthermore, component parts such as optical elements 160, for example, may be omitted.

Figure 17:
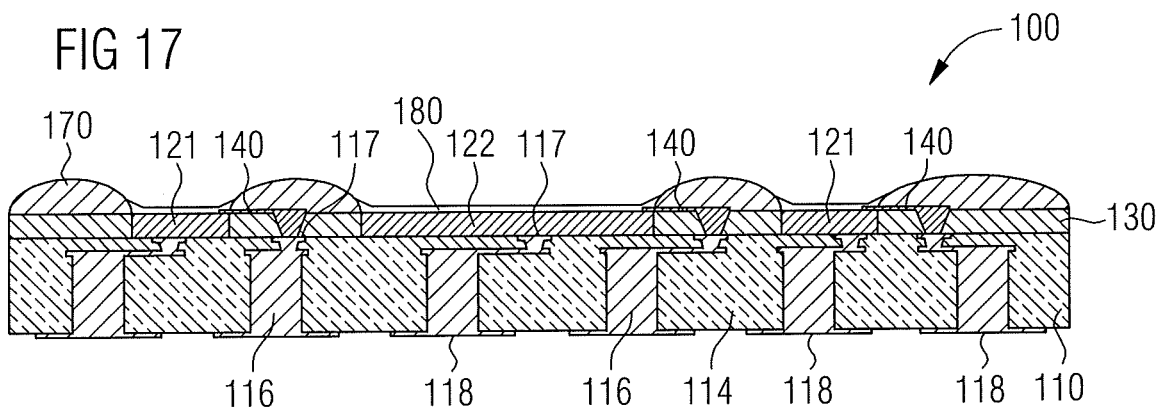
FIG. 17 shows a lateral illustration of a further sensor comprising barrier structures.

In this context, FIG. 17 shows a lateral illustration of a further sensor 100 for exemplary elucidation. The sensor 100 comprises three semiconductor chips 121, 122 arranged on the printed circuit board 110, i.e. two emitters 121 and one detector 122. The emitters 121 may be LED chips, and the detector 122 may be a photodiode chip. The two emitters 121 may be configured to emit different visible light radiations, for example, a red and a green light radiation. The detector 122 may be configured to detect the light radiations. For this purpose, the detector 122 may comprise detection regions coordinated therewith, for example, configured to detect radiation in different wavelength ranges (not illustrated). In this configuration, the sensor 100 may be a biomonitoring sensor, for example, with the aid of which, for example, a blood oxygen content or a pulse beat may be detected.

In accordance with the sensors 100 described above, the semiconductor chips 121, 122 of the sensor 100 shown in FIG. 17 are circumferentially enclosed by the embedding layer 130 and, in the manner described above, electrically connect to front-side contact surfaces 117 of conductor structures 116 of the printed circuit board 110. Furthermore, the sensor 100 comprises one contiguous radiation-nontransmissive barrier structure 170 or a plurality of separate barrier structures 170 on the surface constituted by the semiconductor chips 121, 122, the embedding layer 130, the insulating layers 150 and the contact layers 140. Relative to a plan view consideration (not shown) of the sensor 100, the barrier structure 170 or the barrier structures 170 is/are present in regions next to and between the semiconductor chips 121, 122.

In a configuration of the sensor 100 shown in FIG. 17 with separate barrier structures 170, the latter may be realized in the form of elongate structures. If a continuous barrier structure 170 is used, the barrier structure 170, relative to a plan view consideration, may comprise a configuration extending in a frame-shaped fashion around the individual semiconductor chips 121, 122 and comprising a plurality of recesses. As viewed from above, configurations of the barrier structures(s) 170 comparable to FIG. 11 or 12, for example, may be present.

Furthermore, in regions next to and between sections of the continuous barrier structure 170 or in regions next to and between the separate barrier structures 170, the sensor 100 shown in FIG. 17 comprises a radiation-transmissive layer 180 covering the semiconductor chips 121, 122. In this way, the semiconductor chips 121, 122 may be protected against external influences. The radiation-transmissive layer 180 may cover the barrier structure(s) 170 at the edge, if appropriate as shown in FIG. 17.

To produce sensors 100 comprising the construction shown in FIG. 17, first, the procedure as described above is adopted to provide an arrangement comparable to FIG. 4, i.e. a printed circuit board 110 provided with semiconductor chips 121, 122, the embedding layer 130 and the contact layers 140. Afterward, one contiguous or a plurality of separate barrier structure(s) 170 is/are formed on the arrangement. This may comprise, as described above, for example, dispensing or jetting a radiation-nontransmissive material such as a black epoxy or silicone material, for example. The radiation-nontransmissive material may be applied in the form of a plurality of parallel lines or in the form of a cross-shaped lattice. Afterward or after curing of the barrier structure(s) 170, a radiation-transmissive material is applied in regions next to and between the barrier structure(s) 170 to form the radiation-transmissive layer 180. The radiation-transmissive material may be a transparent epoxy or silicone material, for example, and may be applied by dispensing, for example. In the subsequent singulating process, the sensor assemblage is singulated into separate sensors 100 comprising the construction shown in FIG. 17 (not each illustrated).

Figure 18:
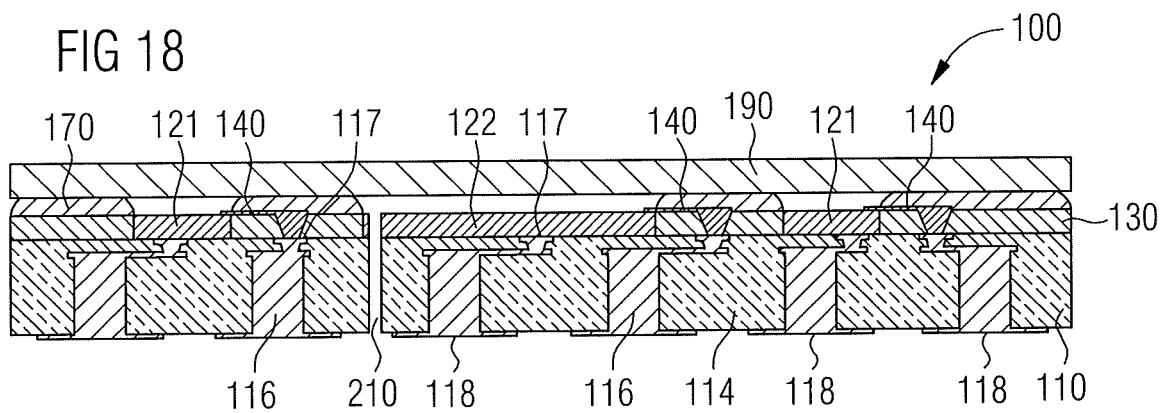
FIG. 18 shows a lateral illustration of a further sensor comprising barrier structures and comprising a cover.

FIG. 18 shows a lateral illustration of a further sensor 100 that may be embodied as a biomonitoring sensor. In contrast to the design shown in FIG. 17, this sensor 100 does not comprise a radiation-transmissive layer 180, but instead a laminar radiation-transmissive cover 190 arranged on the barrier structure(s) 170. The cover 190 may be formed from a glass or plastics material. With the aid of the cover 190, protection of the semiconductor chips 121, 122 against external influences may be achieved in a corresponding manner. The sensor 100 may furthermore comprise at least one optional ventilation hole 210 extending through the printed circuit board 110 and the embedding layer 130 as shown in FIG. 18. Contamination of the cover 190 on account of outgassing of material of the barrier structure(s) 170 may be avoided in this way.

To produce sensors 100 comprising the construction shown in FIG. 18, an arrangement comparable to FIG. 4 is likewise provided. Ventilation holes 210 may be formed as follows. It is possible, for example, for the printed circuit board 110 to be provided with corresponding holes. After forming the embedding layer 130, holes coordinated therewith may be produced in the embedding layer 130, thereby forming ventilation holes 210 extending through the printed circuit board 110 and the embedding layer 130. By way of example, a laser may be used for this purpose. Forming holes in the embedding layer 130 may be carried out, for example, in the context of the above-described process of forming cutouts 135 in the embedding layer 130 (if provided, cf. FIG. 5). Alternatively, the printed circuit board 110 may be provided without holes, and ventilation holes 210 extending through the printed circuit board 110 and the embedding layer 130 may be produced after the process of forming the embedding layer 130.

To subsequently form one or a plurality of barrier structures 170, a radiation-nontransmissive material is applied, for example, by dispensing or jetting, on the printed circuit board 110 provided with the semiconductor chips 121, 122, the embedding layer 130 and the contact layers 140. The radiation-nontransmissive material that may be a black epoxy or silicone material, for example, simultaneously serves as adhesive for the radiation-transmissive cover 190. For this purpose, the cover 190 is arranged on the radiation-nontransmissive material before curing and secured thereon as a result of the curing. The cover 190 may comprise lateral dimensions such that the cover 190 is initially still assigned to all the sensors 100 to be produced and therefore extends over the regions of all the sensors 100. In the singulating process, the cover 190 may be severed into smaller covers 190 of the individual sensors 100.

On the basis of FIGS. 19 to 22, a description is given of further method sequences of producing sensors 100 comprising a construction corresponding to FIG. 17 comprising a radiation-transmissive layer 180 and one or a plurality of barrier structures 170. In this example, in a departure from the procedure explained with reference to FIG. 17, the radiation-transmissive layer 180 is formed first. These sensors 100 may also be biomonitoring sensors.

Figure 19:
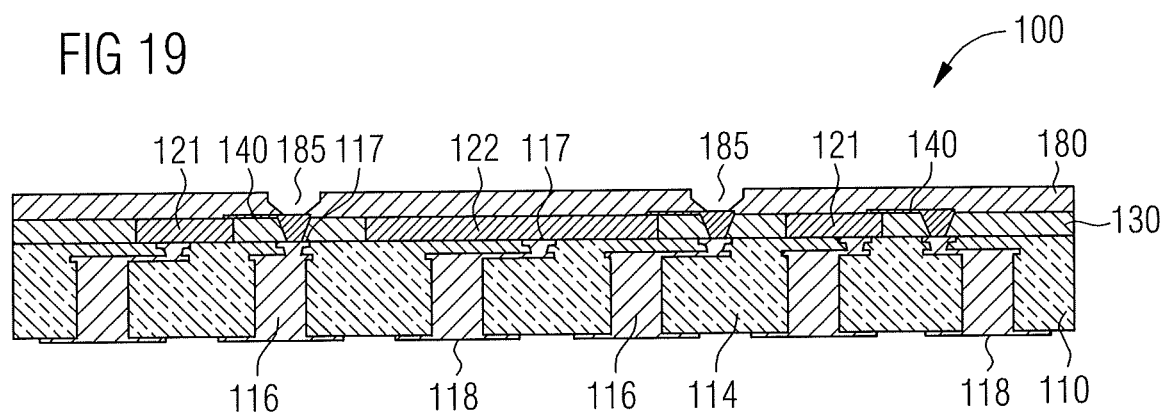
FIGS. 19 and 20 show production of a further sensor comprising barrier structures on the basis of lateral illustrations.
Figure 20:
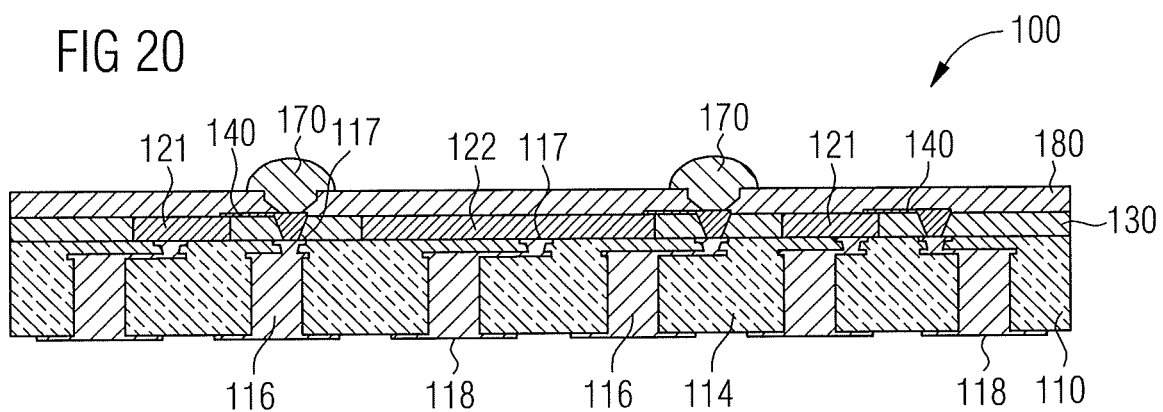

Steps of such a method sequence are elucidated in the lateral illustrations in FIGS. 19 and 20. In each example, an excerpt in the region of one of the sensors 100 produced in an assemblage is shown. The method sequence likewise involves providing an arrangement comparable to FIG. 4. A continuous radiation-transmissive layer 180 is formed on the arrangement. This step comprises applying a radiation-transmissive material, for example, a transparent epoxy or silicone material by spray coating or film lamination, for example. Afterward, as shown in FIG. 19, at least one trench structure 185 is formed in the radiation-transmissive layer 180, the geometric plan view shape of which is coordinated with the at least one barrier structure 170 to be produced. In accordance with the configurations mentioned above with regard to barrier structures 170, by way of example, a plurality of linear trench structures 185 extending parallel to one another may be formed. It is also possible to form a contiguous trench structure 185 in the form of a cross-shaped lattice. Forming the trench structure(s) 185 may be carried out, for example, with the aid of a mechanical process, for example, sawing or with the aid of a laser (not each illustrated).

Afterward, as shown in FIG. 20, a radiation-nontransmissive material is applied in the region of the trench structure(s) 185, thereby forming one or a plurality of barrier structures 170. Dispensing or jetting a black epoxy or silicone material is possible, for example. This step is carried out in a manner filling the trench structure(s) 170 in the process. Furthermore, the barrier structure(s) 170 are formed with a larger thickness than the radiation-transmissive layer 180 and, above the layer 180, with a larger width than the trench structure(s) 170 such that the barrier structure(s) also cover/covers the layer 180 laterally with respect to the trench structure(s) 185. After forming the barrier structure(s) 170, the sensor assemblage is singulated into separate sensors 100.

Figure 21:
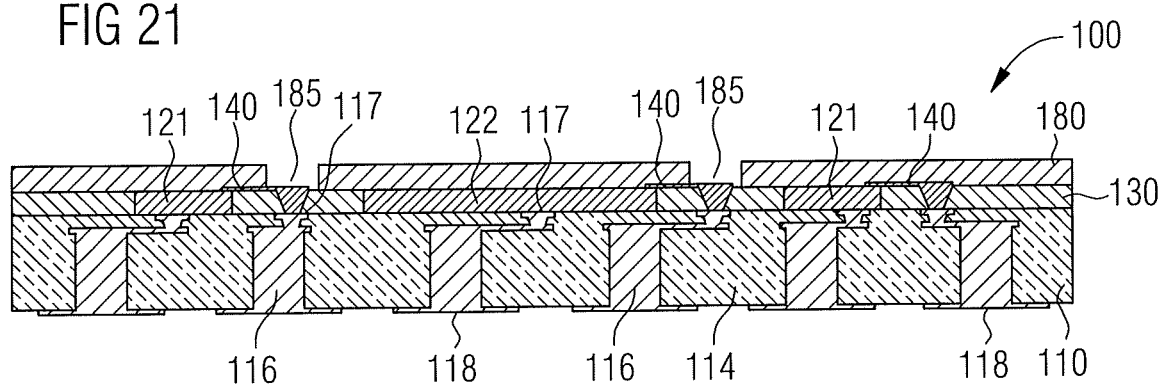
FIGS. 21 and 22 show production of a further sensor comprising barrier structures on the basis of lateral illustrations.
Figure 22:
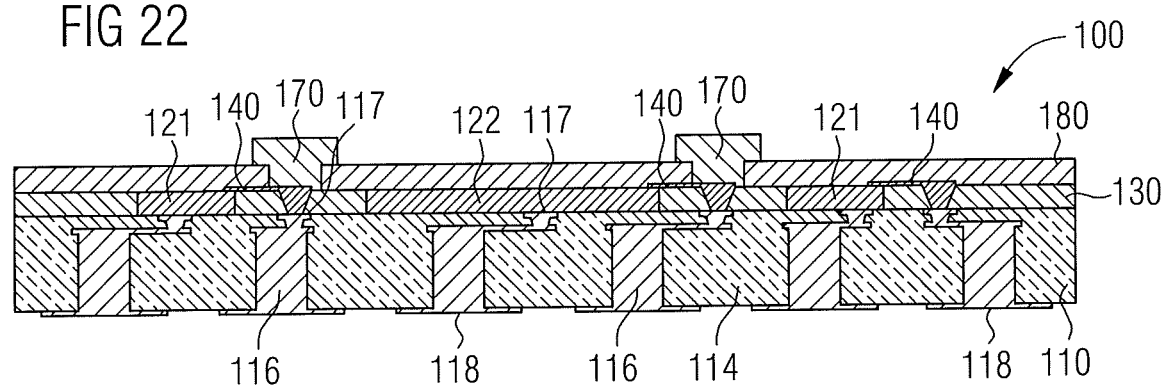

FIGS. 21 and 22 show a further possible method sequence on the basis of lateral illustrations. An excerpt in the region of one of the sensors 100 produced in the assemblage is shown here, too. The method sequence likewise involves providing an arrangement comparable to FIG. 4. A radiation-transmissive layer 180 is formed on the arrangement, for example, with a layer thickness of 20 μm to 50 μm comprising a plurality of separate trench structures 185 or one contiguous trench structure 185. In accordance with the method sequence described above, by way of example, a plurality of linear trench structures 185 extending parallel to one another or one contiguous trench structure 185 in the form of a cross-shaped lattice may be provided. Owing to the trench structure(s) 185, the layer 180 may be subdivided into a plurality of separate layer sections. Forming the layer 180 comprising one or a plurality of trench structures 185 may be carried out, for example, by applying a radiation-transmissive material, for example, a transparent epoxy or silicone material, by spraying with the aid of a shadow mask comprising cutouts and serving as a stencil (not illustrated).

Afterward, as shown in FIG. 22, a radiation-nontransmissive material is applied in the region of the trench structure(s) 185, thereby forming one or a plurality of barrier structures 170. This step is also carried out in a manner filling the trench structure(s) 170. Furthermore, the barrier structure(s) 170 is/are formed with a larger thickness than the radiation-transmissive layer 180 and, above the layer 180, with a larger width than the trench structure(s) 170 such that the barrier structure(s) also covers/cover the layer 180 laterally with respect to the trench structure(s) 185. The radiation-nontransmissive material may, for example, be a black epoxy or silicone material and be applied by dispensing. It is also possible to apply such a material by spraying using a further shadow mask (not illustrated). This shadow mask comprises larger or wider cutouts in contrast to the shadow mask used to apply the radiation-transmissive layer 180 by spraying such that the barrier structure(s) 170 as shown in FIG. 22 is/are made wider than the trench structure(s) 185. Tolerances of the mask offset of the shadow masks may be compensated for in this way. After forming the barrier structure(s) 170, the sensor assemblage is singulated into separate sensors 100.

Figure 23:
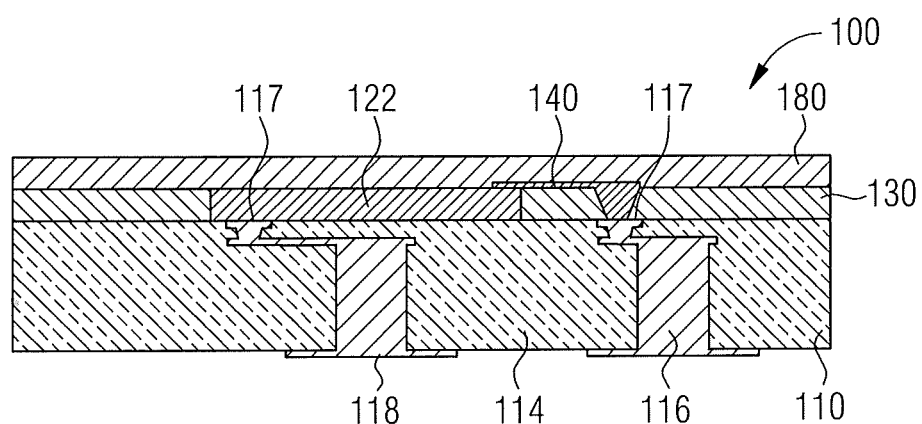
FIG. 23 shows a lateral illustration of a further sensor comprising a single semiconductor chip.

FIG. 23 shows a lateral illustration of a further sensor 100. The sensor 100 comprises a single detector 122 arranged on the printed circuit board 110. The detector 122 may be a photodiode chip and configured to detect visible light radiation. As a result, the sensor 100 may be a light sensor. In accordance with the sensors 100 described above, the detector 122 is circumferentially enclosed by the embedding layer 130 and, in the manner described above, electrically connects to front-side contact surfaces 117 of conductor structures 116 of the printed circuit board 110. Furthermore, the sensor 100 comprises a radiation-transmissive layer 180 on the surface constituted of the semiconductor chips 121, 122, the embedding layer 130, the insulating layers 150 and the contact layers 140. In this way, the detector 122 may be protected against external influences.

To produce sensors 100 comprising the construction shown in FIG. 23, first, the procedure as described above is adopted to provide an arrangement comparable to FIG. 4, i.e. a printed circuit board 110 provided with detectors 122, the embedding layer 130 and the contact layers 140. Afterward, a radiation-transmissive material to form the radiation-transmissive layer 180 is applied on the arrangement. The radiation-transmissive material may be a transparent epoxy or silicone material, for example, and may be applied by spray coating, for example. In the subsequent singulating process, the sensor assemblage is singulated into separate sensors 100 comprising the construction shown in FIG. 23 (not each illustrated).

Further examples that may comprise further modifications and/or combinations of features are possible besides the examples depicted and described above. It is possible, for example, instead of the materials indicated above, to use other materials for sensors 100. Furthermore, the following modifications, not illustrated, may be considered.

Forming optical elements 160 may be carried out with the aid of a molding process, in a departure from the methods described above. If sensors 100 that additionally comprise one or a plurality of barrier structures 170 are produced, the optical elements 160 may be fabricated beforehand. The molding process may be a UV molding process. In this example, a UV-curing plastics material is used to form the optical elements 160, which material may be cured with the aid of UV radiation. A tool which in the molding process and in which the printed circuit board 110 provided with the semiconductor chips 121, 122, the embedding layer 130 and the contact layers 140 may be received comprises a tool part that is transparent to UV radiation and comprises cavities. The cavities comprise a shape coordinated with the optical elements to be produced. The radiation-transmissive material may be applied on the printed circuit board 110 provided with the semiconductor chips 121, 122, the embedding layer 130 and the contact layers 140 and may be pressed into shape with the aid of the tool part. Alternatively, it is possible to introduce the radiation-transmissive material into the cavities of the tool part, for example, by dispensing, and then to apply it with the aid of the tool part on the printed circuit board 110 provided with the semiconductor chips 121, 122, the embedding layer 130 and the contact layers 140. Both the steps mentioned above are carried out in a liquid or viscous state of the radiation-transmissive material. To complete the optical elements 160, the radiation-transmissive material is irradiated with UV radiation through the tool part.

With regard to the method sequences explained with reference to FIGS. 10 to 14, one possible modification consists, for example, of not forming any optical elements 160. Instead, in a manner comparable to the design shown in FIG. 17, in regions next to or between the barrier structure(s) 170, a plane radiation-transmissive layer may be formed by applying a radiation-transmissive material.

Furthermore, it is possible to realize sensors 100 comprising different numbers of emitters 121 and/or detectors 122 in a departure from the configurations described above and depicted in the figures. In this context, attention is furthermore drawn to the possibility of using, instead of detectors 122 comprising a plurality of detection regions 124, separate detectors 122 that may be configured to detect radiation in different wavelength ranges.

A further possible modification is, for example, sensors 100 comprising at least one semiconductor chip of a different type besides one or a plurality of optoelectronic semiconductor chips. This may involve a driver chip, for example.

The detectors 122 used may comprise additional circuit structures for evaluation. Such detectors 122 may be realized, for example, in the form of ASIC chips (Application Specific Integrated Circuit).

Furthermore, semiconductor chips used to form sensors 100 may comprise one or else a plurality of front-side contacts. The latter example may be considered, for example, with regard to detectors 122 comprising a plurality of detection regions 124, as a result of which the latter may be operated separately. Configurations in which semiconductor chips comprise only front-side contacts are also possible, for example. In a corresponding manner, semiconductor chips comprising a plurality of rear-side contacts may be used. Features and details described above may be applied in a corresponding manner for the plurality of contacts of a semiconductor chip. In a semiconductor chip comprising a plurality of front-side contacts, by way of example, each front-side contact may connect to a contact surface 117 of a printed circuit board 110 via a contact layer 140 and, if appropriate, additionally via an electrical connection element 155.

Although our sensors and methods have been more specifically illustrated and described in detail by preferred examples, nevertheless this disclosure is not restricted by the examples and other variations may be derived therefrom by those skilled in the art, without departing from the scope of protection of the appended claims.

This application claims priority of DE 10 2016 118 990.1, the subject matter of which is incorporated herein by reference.

The invention claimed is:

1. A method of producing sensors, comprising:
   providing a printed circuit board;
   arranging semiconductor chips on the printed circuit board, wherein the semiconductor chips each comprising a front-side contact, and for each sensor, at least one radiation-detecting semiconductor chip is arranged on the printed circuit board;
   applying an embedding material on the printed circuit board that forms an embedding layer, laterally adjoining the semiconductor chips;
   forming contact layers connected to the front-side contacts of the respective semiconductor chips; and
   singulating the printed circuit board provided with the semiconductor chips, the embedding layer and the contact layers into separate sensors, each sensor comprising a section of the printed circuit board, the at least one radiation-detecting semiconductor chip arranged on the section of the printed circuit board, and a section of the embedding layer arranged on the section of the printed circuit board and laterally adjoining the at least one semiconductor chip.

2. The method according to claim 1,
   wherein the arranging of the semiconductor chips is carried out after providing the printed circuit board,
   the applying of the embedding material is carried out after the arranging of the semiconductor chips,
   the forming of the contact layers is carried out after the applying of the embedding material, and
   the singulating of the printed circuit board is carried out after the forming of the contact layers.

3. The method according to claim 1, wherein cutouts are formed in the embedding layer via which contact surfaces of the printed circuit board are at least partly uncovered, and the contact layers are formed such that the contact layers connect to the contact surfaces of the printed circuit board.

4. The method according to claim 1, wherein electrical connection elements are arranged on contact surfaces of the printed circuit board, the embedding layer is formed in a manner laterally adjoining the electrical connection elements, and the contact layers are formed such that the contact layers connect to the electrical connection elements.

5. The method according to claim 1, further comprising one of:
   a radiation-transmissive material that forms optical elements applied on the printed circuit board provided with the semiconductor chips, the embedding layer and the contact layers; or
   a radiation-transmissive material that forms optical elements applied on the printed circuit board provided with the semiconductor chips, the embedding layer and the contact layers, the optical elements are formed in the form of lenses, and a lens shape of the lenses is set by thixotropy and/or overhead curing.

6. The method according to claim 1,
   wherein a radiation-nontransmissive material that forms at least one radiation-nontransmissive barrier structure is applied on the printed circuit board provided with the semiconductor chips, the embedding layer and the contact layers, and
   the radiation-nontransmissive material is applied in the form of the at least one barrier structure.

7. The method according to claim 1,
   wherein a radiation-nontransmissive material that forms at least one radiation-nontransmissive barrier structure is applied on the printed circuit board provided with the semiconductor chips, the embedding layer and the contact layers, and
   the radiation-nontransmissive material is applied in the form of a layer and the layer is subsequently patterned into the at least one barrier structure.

8. The method according to claim 7, wherein the radiation-nontransmissive material is a black photoresist material, and the patterning of the layer is carried out by exposure and development.

9. The method according to claim 7, wherein a radiation-transmissive cover is arranged on the radiation-nontransmissive material.

10. The method according to claim 1, wherein a radiation-transmissive material that forms a radiation-transmissive layer is applied on the printed circuit board provided with the semiconductor chips, the embedding layer and the contact layers.

11. The method according to claim 10, wherein the radiation-transmissive layer is formed with a trench structure or a trench structure is formed in the radiation-transmissive layer, and a radiation-nontransmissive material that forms a radiation-nontransmissive barrier structure is applied in a region of the trench structure.

12. A method of producing sensors, comprising:
providing a printed circuit board;
arranging semiconductor chips on the printed circuit board, wherein the semiconductor chips comprise a front-side contact, and for each sensor, at least one radiation-detecting semiconductor chip is arranged on the printed circuit board;
applying an embedding material on the printed circuit board that forms an embedding layer, laterally adjoining the semiconductor chips;
forming contact layers connected to the front-side contacts of the respective semiconductor chips;
singulating the printed circuit board provided with the semiconductor chips, the embedding layer and the contact layers into separate sensors each comprising at least one radiation-detecting semiconductor chip, wherein the printed circuit board provided comprises electrical conductor structures comprising contact surfaces, and the method further comprises one of:
forming cutouts in the embedding layer via which contact surfaces of the printed circuit board are at least partly uncovered, subsequently forming the contact layers such that the contact layers connect to the at least partly uncovered contact surfaces of the printed circuit board, and the front-side contacts of the semiconductor chips electrically connect to the at least partly uncovered contact surfaces of the printed circuit board via the contact layers; or arranging electrical connection elements on contact surfaces of the printed circuit board, subsequently forming the embedding layer in a manner laterally adjoining the electrical connection elements, subsequently forming the contact layers such that the contact layers connect to the electrical connection elements and the front-side contacts of the semiconductor chips electrically connect to the contact surfaces of the printed circuit board, on which contact surfaces the electrical connection elements are arranged, via the contact layers and the electrical connection elements.

\* \* \* \* \*